United States Patent
Lim et al.

(10) Patent No.: US 11,502,255 B2
(45) Date of Patent: Nov. 15, 2022

(54) PHOTOACTIVE LAYER AND ORGANIC SOLAR CELL COMPRISING SAME

(71) Applicant: LG CHEM, LTD., Seoul (KR)

(72) Inventors: Bogyu Lim, Daejeon (KR); Han Young Woo, Seoul (KR); Songrim Jang, Daejeon (KR); Kyungkon Kim, Seoul (KR); Ji Hee Kim, Seoul (KR)

(73) Assignee: LG CHEM, LTD., Seoul (KR)

( * ) Notice: Subject to any disclaimer, the term of this patent is extended or adjusted under 35 U.S.C. 154(b) by 131 days.

(21) Appl. No.: 16/488,982

(22) PCT Filed: Nov. 9, 2018

(86) PCT No.: PCT/KR2018/013596
§ 371 (c)(1),
(2) Date: Aug. 27, 2019

(87) PCT Pub. No.: WO2019/107790
PCT Pub. Date: Jun. 6, 2019

(65) Prior Publication Data
US 2020/0066992 A1   Feb. 27, 2020

(30) Foreign Application Priority Data

Nov. 28, 2017 (KR) .................. 10-2017-0160644
Nov. 6, 2018 (KR) .................. 10-2018-0135177

(51) Int. Cl.
*H01L 51/00* (2006.01)
*H01L 51/42* (2006.01)
*H01L 51/50* (2006.01)

(52) U.S. Cl.
CPC ...... *H01L 51/0036* (2013.01); *H01L 51/0043* (2013.01); *H01L 51/0068* (2013.01);
(Continued)

(58) Field of Classification Search
CPC ............. H01L 51/0036; H01L 51/0043; H01L 51/0068; H01L 51/0072; H01L 51/4253;
(Continued)

(56) References Cited

U.S. PATENT DOCUMENTS

2005/0022856 A1\* 2/2005 Komatsu ............. H01L 51/4253
136/243
2005/0263183 A1\* 12/2005 Nishikitani ......... H01L 51/4253
136/263
(Continued)

FOREIGN PATENT DOCUMENTS

JP   2013199590     10/2013
JP   2016521921 A   7/2016
(Continued)

OTHER PUBLICATIONS

Lim et al. "Silaindacenodithiophene based organic semiconductor for high performance organic field-effect transistors" Dyes and Pigments, 146: 520-528 (2017).
(Continued)

*Primary Examiner* — Andrew J Golden
(74) *Attorney, Agent, or Firm* — Myers Bigel, P.A.

(57) ABSTRACT

The present specification relates to a photoactive layer including: an electron donor; and an electron acceptor, in which the electron donor includes: a single molecular material; and a polymer material, and the single molecular material is represented by Formula 1, and an organic solar cell including the same.

14 Claims, 10 Drawing Sheets

(52) U.S. Cl.
CPC ........ *H01L 51/0072* (2013.01); *H01L 51/424* (2013.01); *H01L 51/5056* (2013.01); *H01L 51/5072* (2013.01); *H01L 51/5092* (2013.01)

(58) Field of Classification Search
CPC .............. H01L 51/4273; H01L 51/424; H01L 51/42–448; H01L 51/5072–5084
USPC ......................................................... 136/263
See application file for complete search history.

(56) References Cited

U.S. PATENT DOCUMENTS

| | | | |
|---|---|---|---|
| 2008/0223445 A1* | 9/2008 | Marks | H01L 51/4273 438/82 |
| 2009/0108255 A1* | 4/2009 | Bazan | H01L 51/4253 257/40 |
| 2016/0141536 A1 | 5/2016 | Lee et al. | |
| 2016/0372680 A1 | 12/2016 | Lim et al. | |

FOREIGN PATENT DOCUMENTS

| | | | | |
|---|---|---|---|---|
| JP | 2017513877 A | 6/2017 | | |
| KR | 20120111203 | 10/2012 | | |
| KR | 101390666 | 4/2014 | | |
| KR | 101400902 | 5/2014 | | |
| KR | 20150072731 | 6/2015 | | |
| KR | 20160127106 | 11/2016 | | |
| KR | 20170112882 | 10/2017 | | |
| WO | 2012165670 | 12/2012 | | |
| WO | WO-2014055976 A1 * | 4/2014 | ........... | H01L 51/424 |
| WO | WO-2015163614 A1 * | 10/2015 | ......... | H01L 51/0072 |
| WO | 2016175573 | 11/2016 | | |

OTHER PUBLICATIONS

Tang, C.W. "Two-layer organic photovoltaic cell" Appl. Physic. Lett., 48(2): 183-185 (1986).

Yu et al. "Polymer Photovoltaic Cells: Enhanced Efficiencies via a Network of Internal Donor-Acceptor Heterojunctions" Science, 270: 1789-1791 (1995).

Nguyen et al. "Semi-crystalline photovoltaic polymers with efficiency exceeding 9% in a ~300 nm thick conventional single-cell devicet" Energy & Environmental Science, 7: 3040-3051 (2014).

International Search Report corresponding to PCT/KR2018/013596 (dated Feb. 15, 2019) (5 pages including English translation).

* cited by examiner

PHOTOACTIVE LAYER AND ORGANIC SOLAR CELL COMPRISING SAME

CROSS REFERENCE TO RELATED APPLICATIONS

This application is a 35 U.S.C. § 371 national stage application of PCT International Application No. PCT/KR2018/013596, filed Nov. 9, 2018, which claims priority from Korean Patent Application Nos. 10-2017-0160644 and 10-2018-0135177, filed Nov. 28, 2017 and Nov. 6, 2018, respectively, the contents of which are incorporated herein in their entireties by reference. The above-referenced PCT International Application was published in the Korean language as International Publication No. WO 2019/107790 A1 on Jun. 6, 2019.

TECHNICAL FIELD

The present specification relates to a photoactive layer and an organic solar cell including the same.

BACKGROUND ART

An organic solar cell is a device which may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art have already shown the limitation in economic feasibility and material demands and supplies, an organic semiconductor solar cell, which is easily processed and inexpensive and has various functionalities, has come into the spotlight as a long-term alternative energy source.

For the solar cell, it is important to increase efficiency so as to output as much electric energy as possible from solar energy. In order to increase the efficiency of the solar cell, it is important to generate as many excitons as possible inside a semiconductor, but it is also important to pull the generated charges to the outside without loss. One of the reasons for the charge loss is the dissipation of generated electrons and holes due to recombination. Various methods have been proposed to deliver generated electrons and holes to an electrode without loss, but additional processes are required in most cases, and accordingly, manufacturing costs may be increased.

DETAILED DESCRIPTION OF INVENTION

Technical Problem

The present specification provides a photoactive layer and an organic solar cell including the same.

Technical Solution

An exemplary embodiment of the present specification provides a photoactive layer including: an electron donor; and an electron acceptor, in which the electron donor includes: a single molecular material; and a polymer material, and the single molecular material is represented by the following Formula 1:

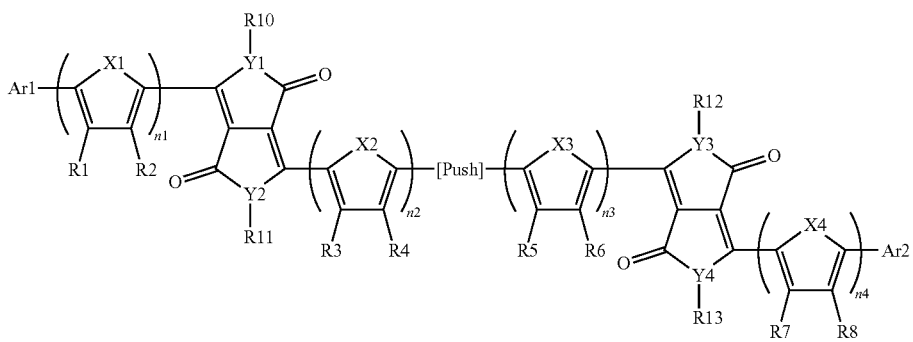

[Formula 1]

in Formula 1, n1 to n4 are each an integer from 1 to 3, when n1 to n4 are each 2 or more, two or more structures in the parenthesis are the same as or different from each other, X1 to X4 are the same as or different from each other, and are each independently $CR_aR_b$, $NR_a$, O, $SiR_aR_b$, $PR_a$, S, $GeR_aR_b$, Se, or Te, Y1 to Y4 are the same as or different from each other, and are each independently $CR_c$, N, $SiR_c$, P, or $GeR_c$, R1 to R8, R10 to R13, $R_a$, $R_b$, and $R_c$ are the same as or different from each other, and are each independently hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group, Ar1 and Ar2 are the same as or different from each other, and are each independently any one of the following structures,

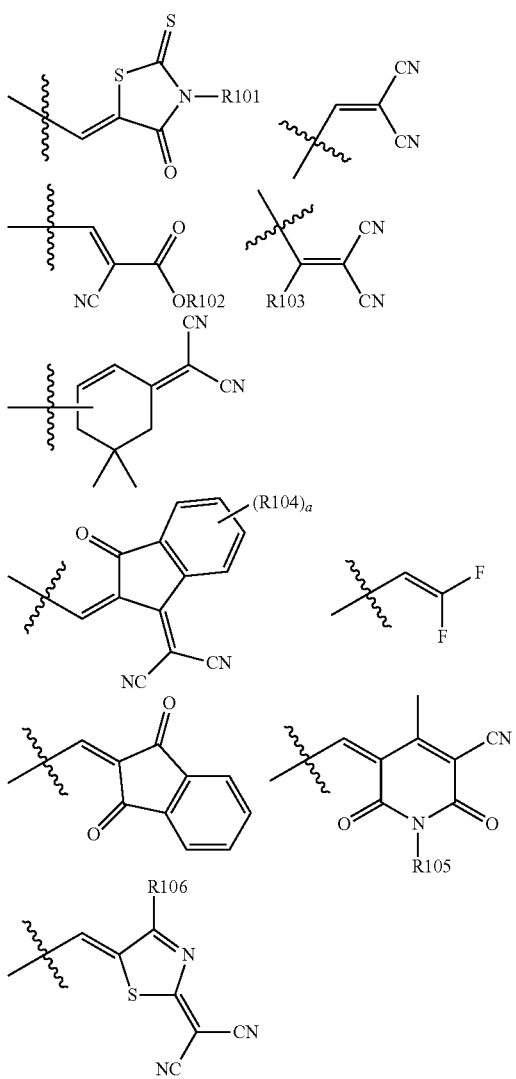

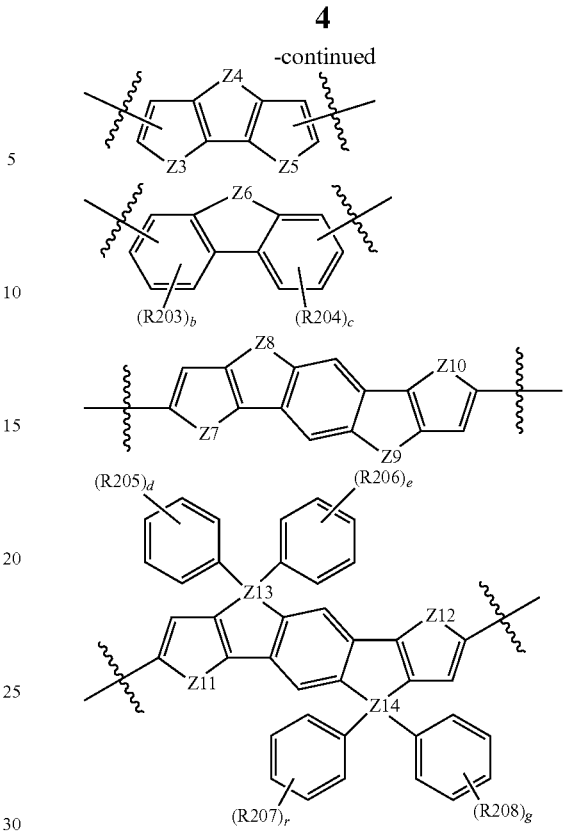

in the structures, a is an integer from 1 to 4, when a is 2 or more, two or more structures in the parenthesis are the same as or different from each other, R101 to R106 are the same as or different from each other, and are each independently hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group,

[Push] has a structure which acts as an electron donor, and the structure is any one of the following structures,

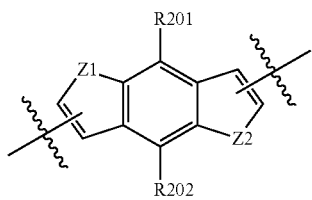

in the structures, b and c are each an integer from 1 to 3, d, e, f, and g are each an integer from 1 to 5, when b, c, d, e, f, and g are each 2 or more, two or more structures in the parenthesis are the same as or different from each other, Z1 to Z12 are the same as or different from each other, and are each independently $CR_dR_e$, $NR_d$, O, $SiR_dR_e$, $PR_d$, S, $GeR_dR_e$, Se, or Te, Z13 and Z14 are the same as or different from each other, and are each independently C, Si, or Ge, and R201 to R208, $R_d$, and $R_e$ are the same as or different from each other, and are each independently hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

Another exemplary embodiment of the present specification provides an organic solar cell including: a first electrode;

a second electrode provided to face the first electrode; and an organic material layer having one or more layers provided between the first electrode and the second electrode and including the above-described photoactive layer.

Advantageous Effects

An organic solar cell according to an exemplary embodiment of the present specification may exhibit excellent characteristics in terms of efficiency, stability, processability, and the like by simultaneously using a single molecular material having reproducibility and a simple process and a polymer material having excellent efficiency as an electron donor of a photoactive layer.

Figure 1:
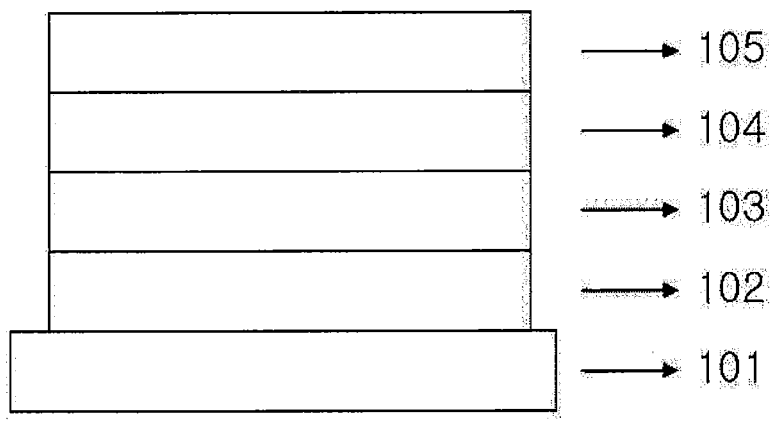
FIG. 1 is a view illustrating an organic solar cell according to an exemplary embodiment of the present specification.

101: Substrate
102: First electrode
103: Hole transport layer
104: Photoactive layer
105: Second electrode

BEST MODE

Hereinafter, the present specification will be described in detail.

An exemplary embodiment of the present specification provides a photoactive layer including: an electron donor; and an electron acceptor, in which the electron donor includes: a single molecular material; and a polymer material, and the single molecular material is represented by Formula 1.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

In the present specification,

means a moiety linked to another substituent.

In the present specification, the "structure in the parenthesis" means a structure included in the ( ).

In the present specification, "unit" means a repeated structure included in a copolymer. That is, "unit" may mean a structure included in the form of a divalent group or more in a copolymer by a polymerization reaction.

In the present specification, "including a unit" means that the unit is included in a main chain in a polymer.

In the present specification, "single molecule" means a material having one molecular weight without any molecular weight distribution, as a material composed of one structure.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; a nitro group; an imide group; an amide group; a carbonyl group; an ester group; a hydroxyl group; an alkyl group; a cycloalkyl group; an alkoxy group; an aryloxy group; an alkylthioxy group; an arylthioxy group; an alkylsulfoxy group; an arylsulfoxy group; an alkenyl group; a silyl group; a siloxane group; a boron group; an amine group; an arylphosphine group; a phosphine oxide group; an aryl group; and a heterocyclic group, or being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

In the present specification, the halogen group may be fluorine, chlorine, bromine or iodine.

In the present specification, the alkyl group may be straight-chained or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl, and the like, but are not limited thereto.

In the present specification, the cycloalkyl group is not particularly limited, but has preferably 3 to 30 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chained, branched, or cyclic. The number of carbon atoms of the alkoxy group is not particularly limited, but is preferably 1 to 30. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the aryl group may be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, a heterocyclic group includes one or more atoms other than carbon, that is, one or more heteroatoms, and specifically, the heteroatom may include one or more atoms selected from the group consisting of O, N, Se, S, and the like. The number of carbon atoms thereof is not particularly limited, but is preferably 2 to 30, and the heterocyclic group may be monocyclic or polycyclic. Examples of the heterocyclic group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group (phenanthroline), a thiazolyl group, an isoxazolyl group, an oxadiazolyl group, a thiadiazolyl group, a phenothiazinyl group, a dibenzofuranyl group, and the like, but are not limited thereto.

In an exemplary embodiment of the present specification, the [Push] is

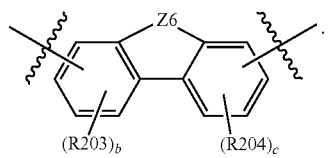

In an exemplary embodiment of the present specification, Formula 1 may be represented by the following Formula 1-1.

[Formula 1-1]

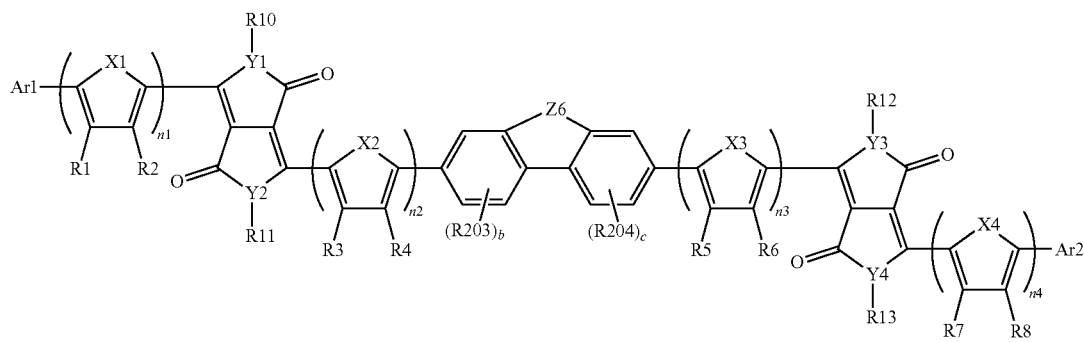

In Formula 1-1, definitions of n1 to n4, X1 to X4, Y1 to Y4, R1 to R8, R10 to R13, Ar1, and Ar2 are the same as those defined in Formula 1, Z6 is $CR_dR_e$, $NR_d$, O, $SiR_dR_e$, $PR_d$, S, $GeR_dR_e$, Se, or Te, b and c are each an integer from 1 to 3, when b and c are each 2 or more, two or more structures in the parenthesis are the same as or different from each other, and R203, R204, $R_d$, and $R_e$ are the same as or different from each other, and are each independently hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, n1 to n4 are each 1 or 2.

In an exemplary embodiment of the present specification, n1 is 2.

In an exemplary embodiment of the present specification, n2 is 1.

In an exemplary embodiment of the present specification, n3 is 1.

In an exemplary embodiment of the present specification, n4 is 2.

In an exemplary embodiment of the present specification, X1 to X4 are each S.

In an exemplary embodiment of the present specification, Y1 to Y4 are each N.

In an exemplary embodiment of the present specification, Z6 is $NR_d$, and $R_d$ is hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, Z6 is $NR_d$, and $R_d$ is a substituted or unsubstituted alkyl group.

In an exemplary embodiment of the present specification, Z6 is $NR_d$, and $R_d$ is a substituted or unsubstituted alkyl group having 1 to 30 carbon atoms.

In an exemplary embodiment of the present specification, Z6 is $NR_d$, and $R_d$ is a substituted or unsubstituted straight-chained or branched alkyl group having 1 to 30 carbon atoms.

In an exemplary embodiment of the present specification, Z6 is $NR_d$, and $R_d$ is a branched alkyl group having 1 to 30 carbon atoms.

In an exemplary embodiment of the present specification, R1 to R8, R10 to R13, R203, and R204 are the same as or different from each other, and are each independently hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, R1 to R8, R10 to R13, R203, and R204 are the same as or different from each other, and are each independently hydrogen; a halogen group; or a substituted or unsubstituted alkyl group.

In an exemplary embodiment of the present specification, R1 to R8 are each hydrogen.

In an exemplary embodiment of the present specification, R10 to R13 are the same as or different from each other, and are each independently a substituted or unsubstituted alkyl group.

In an exemplary embodiment of the present specification, R10 to R13 are the same as or different from each other, and are each independently a substituted or unsubstituted branched alkyl group.

In an exemplary embodiment of the present specification, R10 to R13 are the same as or different from each other, and are each independently a substituted or unsubstituted branched alkyl group having 1 to 30 carbon atoms.

In an exemplary embodiment of the present specification, R10 to R13 are the same as or different from each other, and are each independently a substituted or unsubstituted 2-ethylhexyl group.

In an exemplary embodiment of the present specification, R10 to R13 are each a 2-ethylhexyl group.

In an exemplary embodiment of the present specification, R203 and R204 are each hydrogen.

In an exemplary embodiment of the present specification, Ar1 and Ar2 are each

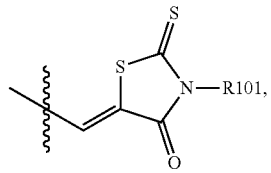

and R101 is hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, Ar1 and Ar2 are each

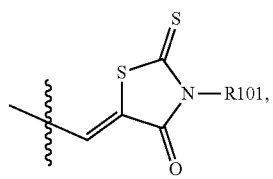

and R101 is a substituted or unsubstituted alkyl group.

In an exemplary embodiment of the present specification, Ar1 and Ar2 are each

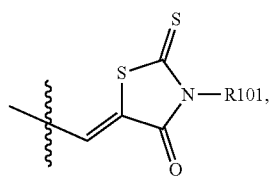

and R101 is a substituted or unsubstituted straight-chained alkyl group.

In an exemplary embodiment of the present specification, Ar1 and Ar2 are each

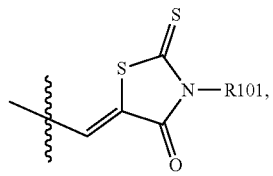

and R101 is a substituted or unsubstituted straight-chained alkyl group having 1 to 10 carbon atoms.

In an exemplary embodiment of the present specification, Ar1 and Ar2 are each

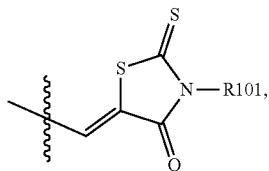

and R101 is an ethyl group.

In an exemplary embodiment of the present specification, the compound represented by Formula 1 is a compound having the following structure.

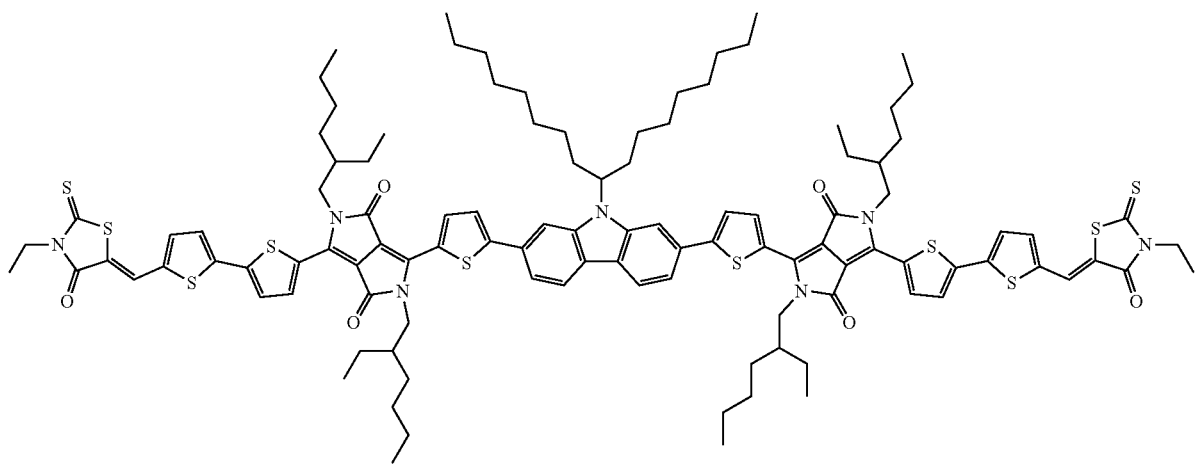 [SMILES: CCCCCCCCC(CCCCCCCC)n1c2cc(-c3ccc(C4=C5C(=O)N(CC(CC)CCCC)C(c6ccc(-c7ccc(/C=C8\SC(=S)N(CC)C8=O)s7)s6)=C5C(=O)N4CC(CC)CCCC)s3)ccc2c2ccc(-c3ccc(C4=C5C(=O)N(CC(CC)CCCC)C(c6ccc(-c7ccc(/C=C8\SC(=S)N(CC)C8=O)s7)s6)=C5C(=O)N4CC(CC)CCCC)s3)cc21]

In an exemplary embodiment of the present specification, the polymer material includes a non-crystalline polymer material or a crystalline polymer material.

In an exemplary embodiment of the present specification, the non-crystalline polymer material includes a first copolymer including a first unit represented by the following Formula 2 and a second unit represented by the following Formula 3.

[Formula 2]

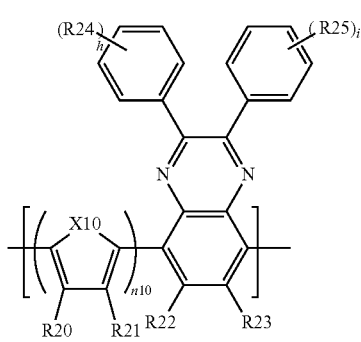

[Formula 3]

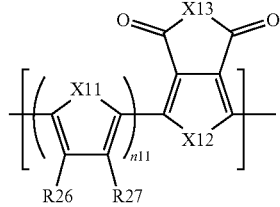

In Formula 2 or 3, n10 and n11 are each an integer from 1 to 3, when n10 and n11 are each 2 or more, two or more structures in the parenthesis are the same as or different from each other, h and i are each an integer from 1 to 5, when h and i are each 2 or more, two or more structures in the parenthesis are the same as or different from each other, X10 to X13 are the same as or different from each other, and are each independently $CR_fR_g$, $NR_f$, O, $SiR_fR_g$, $PR_f$, S, $GeR_fR_g$, Se, or Te, R20 to R27, $R_f$, and $R_g$ are the same as or different from each other, and are each independently hydrogen; deuterium; a halogen group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, a ratio of the first unit to the second unit is 10:1 to 1:10.

In an exemplary embodiment of the present specification, n10 and n11 are each 1.

In an exemplary embodiment of the present specification, h and i are each an integer from 1 to 5.

In an exemplary embodiment of the present specification, R20 and R21 are each hydrogen.

In an exemplary embodiment of the present specification, R22 and R23 are the same as or different from each other, and are each independently a halogen group.

In an exemplary embodiment of the present specification, R22 and R23 are each fluorine.

In an exemplary embodiment of the present specification, R24 and R25 are the same as or different from each other, and are each independently hydrogen or a substituted or unsubstituted alkoxy group.

In an exemplary embodiment of the present specification, R24 and R25 are the same as or different from each other, and are each independently hydrogen or an octoxy group.

In an exemplary embodiment of the present specification, R26 and R27 are each hydrogen.

In an exemplary embodiment of the present specification, X11 and X12 are each S.

In an exemplary embodiment of the present specification, X13 is $NR_f$ and $R_f$ is the same as that described above.

In an exemplary embodiment of the present specification, X13 is $NR_f$, and $R_f$ is a substituted or unsubstituted alkyl group.

In an exemplary embodiment of the present specification, a mass ratio of the first unit to the second unit in the first copolymer is 1:9 to 9:1. More specifically, the mass ratio is 3:7 to 7:3.

In an exemplary embodiment of the present specification, the first copolymer includes the following unit.

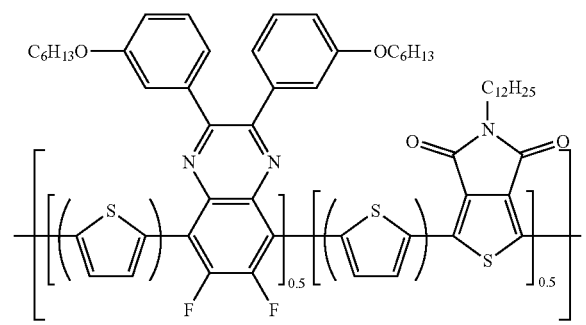

In an exemplary embodiment of the present specification, an end group of the first copolymer is a substituted or unsubstituted aryl group or a substituted or unsubstituted heterocyclic group.

In an exemplary embodiment of the present specification, the end group of the first copolymer is a 4-(trifluoromethyl)phenyl group.

According to an exemplary embodiment of the present specification, the first copolymer has a number average molecular weight of 500 g/mol to 1,000,000 g/mol. Preferably, the first copolymer has a number average molecular weight of 10,000 g/mol to 100,000 g/mol. In an exemplary embodiment of the present specification, the first copolymer has a number average molecular weight of 30,000 g/mol to 70,000 g/mol.

In an exemplary embodiment of the present specification, the crystalline polymer material includes a second copolymer including a unit represented by the following Formula 4 or a unit represented by the following Formula 5.

[Formula 4]

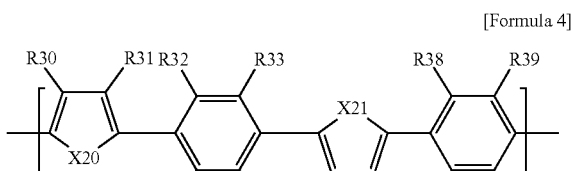

[Formula 5]

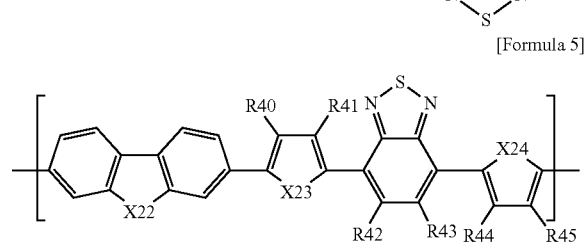

In Formula 4 or 5,

X20 to X24 are the same as or different from each other, and are each independently $CR_hR_i$, $NR_h$, O, $SiR_hR_i$, $PR_h$, S, $GeR_hR_i$, Se, or Te, and R30 to R45, $R_h$, and $R_i$ are the same as or different from each other, and are each independently hydrogen; deuterium; a halogen group; a nitrile group; a substituted or unsubstituted alkoxy group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, X20 and X21 are each S.

In an exemplary embodiment of the present specification, X22 is $NR_h$, and $R_h$ is a substituted or unsubstituted alkyl group.

In an exemplary embodiment of the present specification, X22 is $NR_h$, and $R_h$ is a branched alkyl group.

In an exemplary embodiment of the present specification, X23 and X24 are each S.

In an exemplary embodiment of the present specification, R30 to R45 are the same as or different from each other, and are each independently hydrogen; a halogen group; a nitrile group; or a substituted or unsubstituted alkoxy group.

In an exemplary embodiment of the present specification, R30 and R31 are each hydrogen.

In an exemplary embodiment of the present specification, R32 and R35 are each hydrogen.

In an exemplary embodiment of the present specification, R33 and R34 are the same as or different from each other, and are each independently a substituted or unsubstituted alkoxy group.

In an exemplary embodiment of the present specification, R36 and R37 are each hydrogen.

In an exemplary embodiment of the present specification, R38 and R39 are the same as or different from each other, and are each independently a halogen group; or a nitrile group.

In an exemplary embodiment of the present specification, R38 and R39 are each fluorine.

In an exemplary embodiment of the present specification, R38 and R39 are each a nitrile group.

In an exemplary embodiment of the present specification, R40 to R45 are each hydrogen.

In an exemplary embodiment of the present specification, the second copolymer includes any one of the following units.

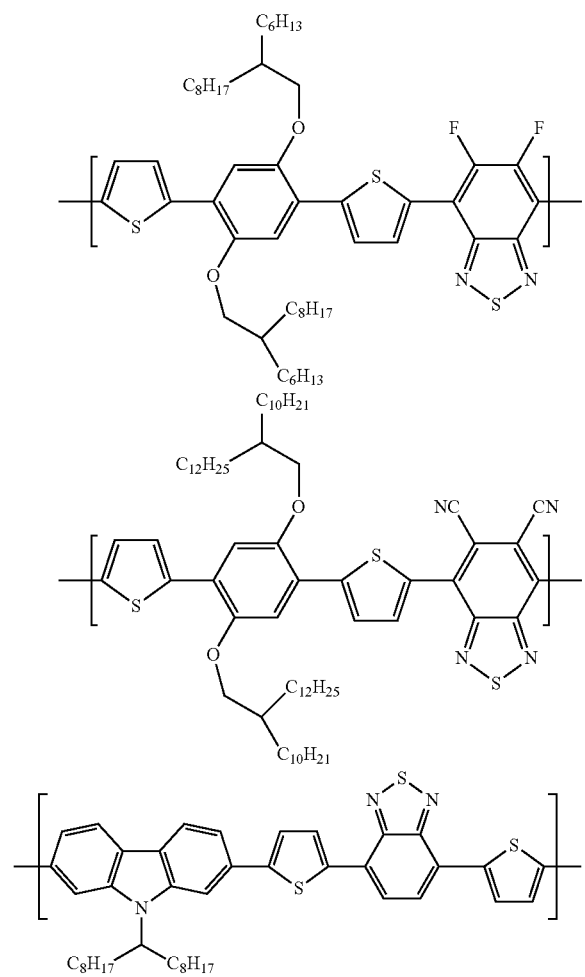

In an exemplary embodiment of the present specification, the second copolymer includes n units, and n is an integer from 1 to 10,000.

In an exemplary embodiment of the present specification, n is an integer from 2 to 8,000.

In an exemplary embodiment of the present specification, an end group of the second copolymer is a substituted or unsubstituted aryl group or a substituted or unsubstituted heterocyclic group.

In an exemplary embodiment of the present specification, the end group of the second copolymer is a 4-(trifluoromethyl)phenyl group.

In an exemplary embodiment of the present specification, the second copolymer has a number average molecular weight of preferably 500 g/mol to 1,000,000 g/mol.

Preferably, the second copolymer has a number average molecular weight of preferably 10,000 g/mol to 100,000 g/mol. In an exemplary embodiment of the present specification, the second copolymer has a number average molecular weight of 30,000 g/mol to 70,000 g/mol.

In an exemplary embodiment of the present specification, a content of the single molecular material in the electron donor is higher than that of the polymer material.

In an exemplary embodiment of the present specification, when the photoactive layer is manufactured, a single molecular material may be included more than a polymer material at a volume ratio of the single molecular material to the polymer material of 99:1 to 51:49.

In an exemplary embodiment of the present specification, the electron acceptor includes a fullerene derivative.

In the present specification, the "fullerene derivative" means a material having one or more spherical shell structures in which a molecule is formed of carbon. Examples of a molecule having a spherical shell include: a fullerene; a fullerene derivative having an inorganic group or an organic group, which is bonded to a carbon constituting fullerene; a fullerene derivative to which a spherical shell structure constituting a fullerene or the fullerene derivative is bonded directly or through one or more elements; and the like.

In an exemplary embodiment of the present specification, the fullerene derivative may include a $C_{61}$ fullerene, a $C_{71}$ fullerene or 1',1'',4',4''-Tetrahydro-di[1,4]methanonaphthaleno[1,2:2',3',56,60:2'',3''][5,6]fullerene-$C_{60}$ (ICBA). Specifically, in an exemplary embodiment of the present specification, the fullerene derivative may be phenyl-$C_{71}$-butyric acid methyl ester ($PC_{71}BM$).

In an exemplary embodiment of the present specification, the photoactive layer may further include an additive.

In an exemplary embodiment of the present specification, the additive may be one or more of 1,8-diiodooctane, diphenyl ether, 1-chloronaphthalene, and 1,2-dichlorobenzene.

An exemplary embodiment of the present specification provides an organic solar cell including: a first electrode; a second electrode provided to face the first electrode; and an organic material layer having one or more layers provided between the first electrode and the second electrode and including the photoactive layer.

FIG. 1 is a view illustrating an organic solar cell including a substrate 101, a first electrode 102, a hole transport layer 103, a photoactive layer 104, and a second electrode 105 according to an exemplary embodiment of the present specification.

In an exemplary embodiment of the present specification, the organic solar cell may further include an additional organic material layer. The organic solar cell may reduce the number of organic material layers by using an organic material which simultaneously has various functions.

In an exemplary embodiment of the present specification, the organic solar cell includes a first electrode, a photoactive layer, and a second electrode. The organic solar cell may further include a substrate, a hole transport layer, and/or an electron transport layer.

In an exemplary embodiment of the present specification, the photoactive layer includes the single molecular material and the polymer material.

In an exemplary embodiment of the present specification, the organic material layer further includes a hole transport layer, a hole injection layer, or a layer which simultaneously transports and injects holes.

In another exemplary embodiment, the organic material layer further includes an electron injection layer, an electron transport layer, or a layer which simultaneously injects and transports electrons.

In an exemplary embodiment of the present specification, when the organic solar cell accepts a photon from an external light source, an electron and a hole are generated between an electron donor and an electron acceptor. The generated hole is transported to a positive electrode through an electron donor.

In an exemplary embodiment of the present specification, the first electrode is a positive electrode, and the second electrode is a negative electrode. In another exemplary embodiment of the present specification, the first electrode is a negative electrode, and the second electrode is a positive electrode.

In an exemplary embodiment of the present specification, an organic solar cell may be arranged in an order of a first electrode, a photoactive layer, and a second electrode based on a light source, and may be arranged in an order of a second electrode, a photoactive layer, and a first electrode based on a light source, but the arrangement order is not limited thereto.

In another exemplary embodiment, the organic solar cell may be arranged in an order of a positive electrode, a hole transport layer, a photoactive layer, an electron transport layer, and a negative electrode, and may be arranged in an order of a negative electrode, an electron transport layer, a photoactive layer, a hole transport layer, and a positive electrode, but the arrangement order is not limited thereto.

In an exemplary embodiment of the present application, the organic solar cell has a normal structure.

In an exemplary embodiment of the present application, the organic solar cell has an inverted structure.

In an exemplary embodiment of the present application, the organic solar cell may have a normal structure in which a substrate, a first electrode, a hole transport layer, a photoactive layer, an electron transport layer, and a second electrode are formed in this order.

In an exemplary embodiment of the present application, the organic solar cell may have an inverted structure in which a substrate, a first electrode, an electron transport layer, a photoactive layer, a hole transport layer, and a second electrode are formed in this order.

In an exemplary embodiment of the present specification, the electron donor and the electron acceptor constitute a bulk heterojunction (BHJ). A material for the electron donor and a material for the electron acceptor may be mixed at a ratio (w/w) of 1:10 to 10:1. Specifically, the material for the electron donor and the material for the electron acceptor may be mixed at a ratio (w/w) of 1:5 to 5:1.

In the present specification, the substrate may be a glass substrate or a transparent plastic substrate having excellent transparency, surface smoothness, ease of handling, and waterproofing properties, but is not limited thereto, and the substrate is not limited as long as the substrate is typically used in the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The first electrode may be a material which is transparent and has excellent conductivity, but is not limited thereto. Examples thereof include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

A method of forming the first electrode is not particularly limited, but the first electrode may be formed, for example, by being applied onto one surface of a substrate or by being coated in the form of a film, using a method such as sputtering, e-beam, thermal deposition, spin coating, screen printing, inkjet printing, doctor blade, or gravure printing.

When the first electrode is formed on a substrate, the first electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100° C. to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film may be easily formed on the first electrode, and the quality of the thin film may also be improved.

Examples of a pre-treatment technology for a first electrode include a) a surface oxidation method using a parallel flat plate-type discharge, b) a method of oxidizing the surface through ozone produced by using UV rays in a vacuum state, c) an oxidation method using oxygen radicals produced by plasma, and the like.

One of the methods may be selected according to the state of the first electrode or the substrate. However, although any method is used, it is preferred to commonly prevent oxygen from being separated from the surface of the first electrode or the substrate, and maximally inhibit moisture and organic materials from remaining. In this case, it is possible to maximize a substantial effect of the pre-treatment.

As a specific example, it is possible to use a method of oxidizing the surface through ozone produced by using UV. In this case, a patterned ITO substrate after being ultrasonically cleaned is baked on a hot plate and dried well, and then introduced into a chamber, and the patterned ITO substrate may be cleaned by ozone generated by allowing an oxygen gas to react with UV light by operating a UV lamp.

However, the surface modification method of the patterned ITO substrate in the present specification need not be particularly limited, and any method may be used as long as the method is a method of oxidizing a substrate.

The second electrode may be a metal having a low work function, but is not limited thereto. Specific examples thereof include: a metal such as magnesium, calcium, sodium, potassium, titanium, indium, yttrium, lithium, gadolinium, aluminum, silver, tin, and lead, or an alloy thereof; and a multi-layer structured material, such as LiF/Al, $LiO_2$/Al, LiF/Fe, Al:Li, Al:$BaF_2$, and Al:$BaF_2$:Ba, but are not limited thereto.

The second electrode may be deposited and formed in a thermal evaporator showing a vacuum degree of $5 \times 10^{-7}$ torr or less, but the forming method is not limited to this method.

A material for the hole transport layer and/or a material for the electron transport layer serve to efficiently transfer electrons and holes separated from a photoactive layer to an electrode, and the materials are not particularly limited.

The material for the hole transport layer may be poly(3,4-ethylenedioxythiophene) doped with poly(styrenesulfonic acid) (PEDOT:PSS) and molybdenum oxide ($MoO_x$); vanadium oxide ($V_2O_5$); nickel oxide (NiO); tungsten oxide ($WO_x$); or the like, but is not limited thereto.

The material for the electron transport layer may be electron-extracting metal oxides, and specific examples thereof include: metal complexes of 8-hydroxyquinoline; complexes including $Alq_3$; metal complexes including Liq; LiF; Ca; titanium oxide ($TiO_x$); zinc oxide (ZnO); cesium carbonate ($Cs_2CO_3$); and the like, but are not limited thereto.

The photoactive layer may be formed by dissolving a photoactive material such as an electron donor and/or an electron acceptor in an organic solvent, and then applying the solution by a method such as spin coating, dip coating, screen printing, spray coating, doctor blade, and brush painting, but the forming method is not limited thereto.

MODE FOR INVENTION

A preparation method of the photoactive layer and the manufacture of an organic solar cell including the same will be described in detail in the following Preparation Examples and Examples. However, the following Examples are provided for exemplifying the present specification, and the scope of the present specification is not limited thereby.

Preparation Example 1. Production of Compound 1 (Single Molecular Material)
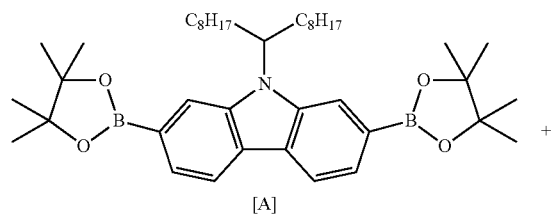
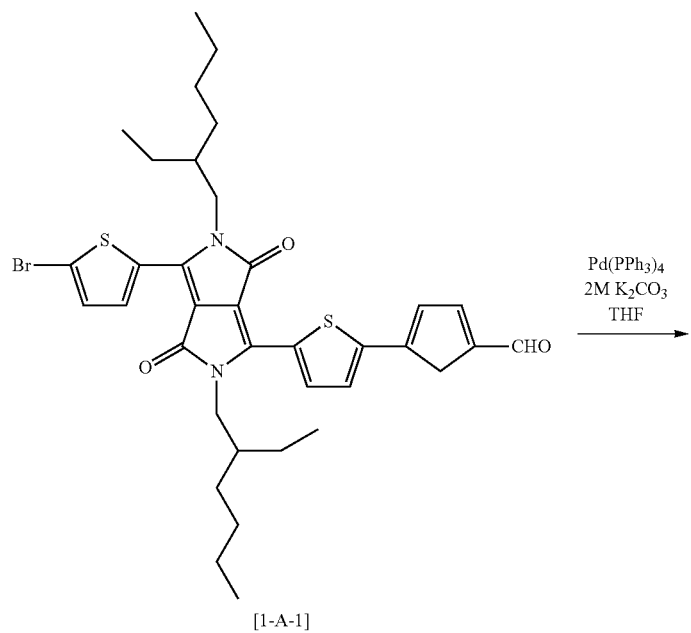
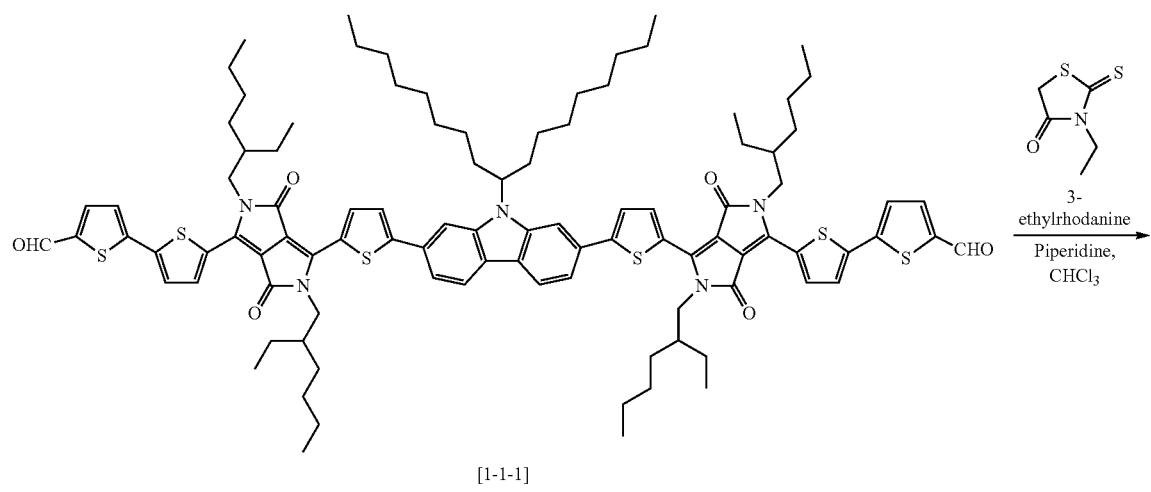

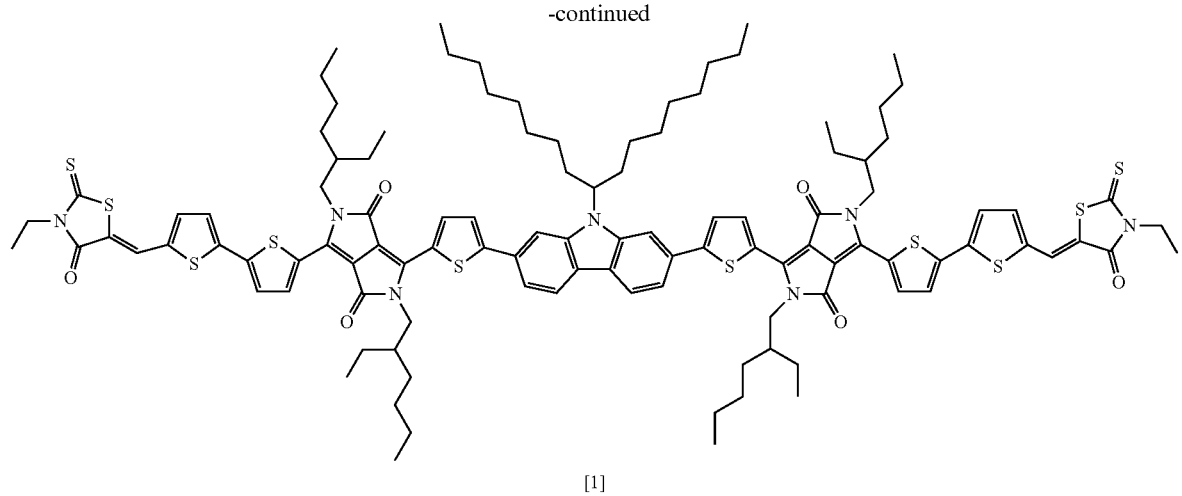

[1]

(1) After Compound A (0.46 g, 0.7 mmol) and Compound 1-A-1 (1.07 g, 1.5 mmol) were dissolved in 30 mL of tetrahydrofuran (THF) and a and tetrakis(triphenylphosphine)palladium(0) (Pd(PPh$_3$)$_4$) catalyst (0.0578 g, 0.05 mmol) was added thereto, 7.5 mL of 2 M K$_2$CO$_3$ was added thereto, and the resulting solution was stirred at 70° C. for 48 hours. After the reaction, an extraction was performed with dichloromethane (DCM), the remaining water was removed by using magnesium sulfate (MgSO$_4$), and then the solvent was removed under reduced pressure. Compound 1-1-1 was obtained by subjecting the remaining product to silica column (eluent: DCM to CHCl$_3$). (Yield: 59%)

(2) Compound 1-1-1 (0.401 g, 0.24 mmol), three drops of piperidine, and 3-ethylrhodanine (0.743 g, 4.61 mmol) were put into 25 mL of chloroform (CHCl$_3$), and the resulting solution was refluxed under nitrogen for 24 hours. After the reaction, the solution was extracted with dichloromethane (DCM), the remaining water was removed by using magnesium sulfate (MgSO$_4$), and then the solvent was removed under reduced pressure. Compound 1 was obtained by subjecting the remaining product to silica column (eluent: CHCl$_3$ to ethyl acetate (EA)).

Figure 2:
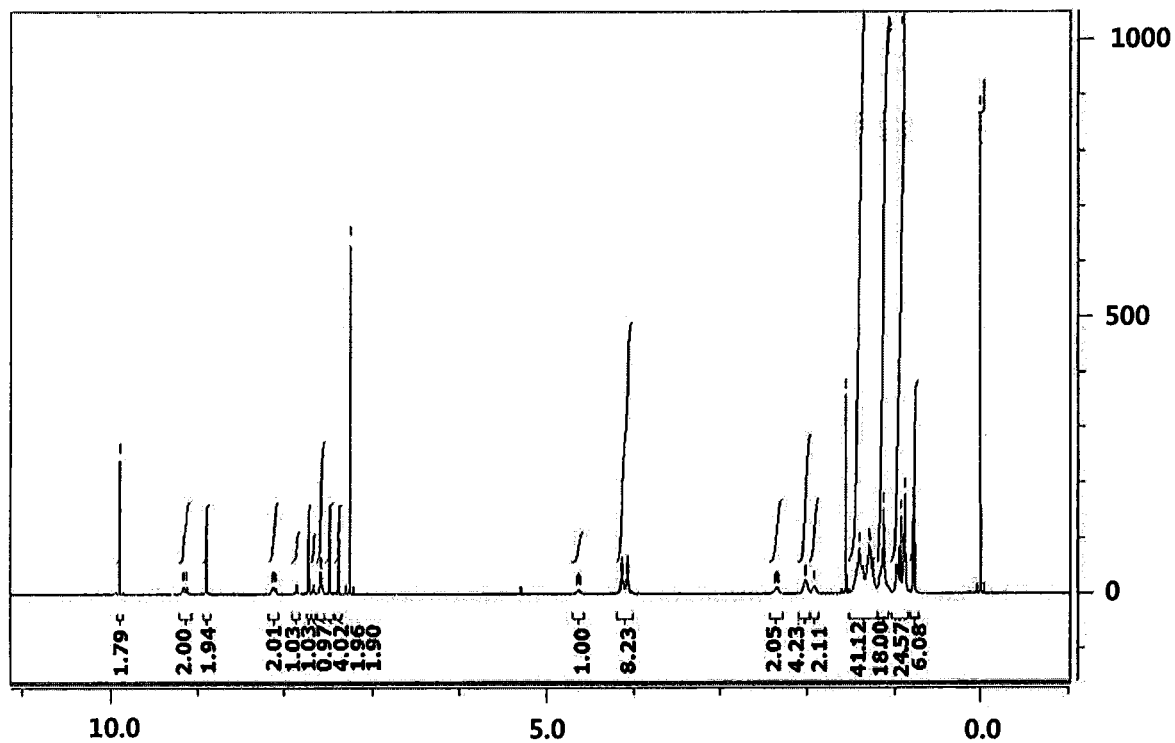
FIG. 2 is a view illustrating NMR data of Compound 1-A-1.

FIG. 2 is a view illustrating NMR data of Compound 1-A-1.

Figure 3:
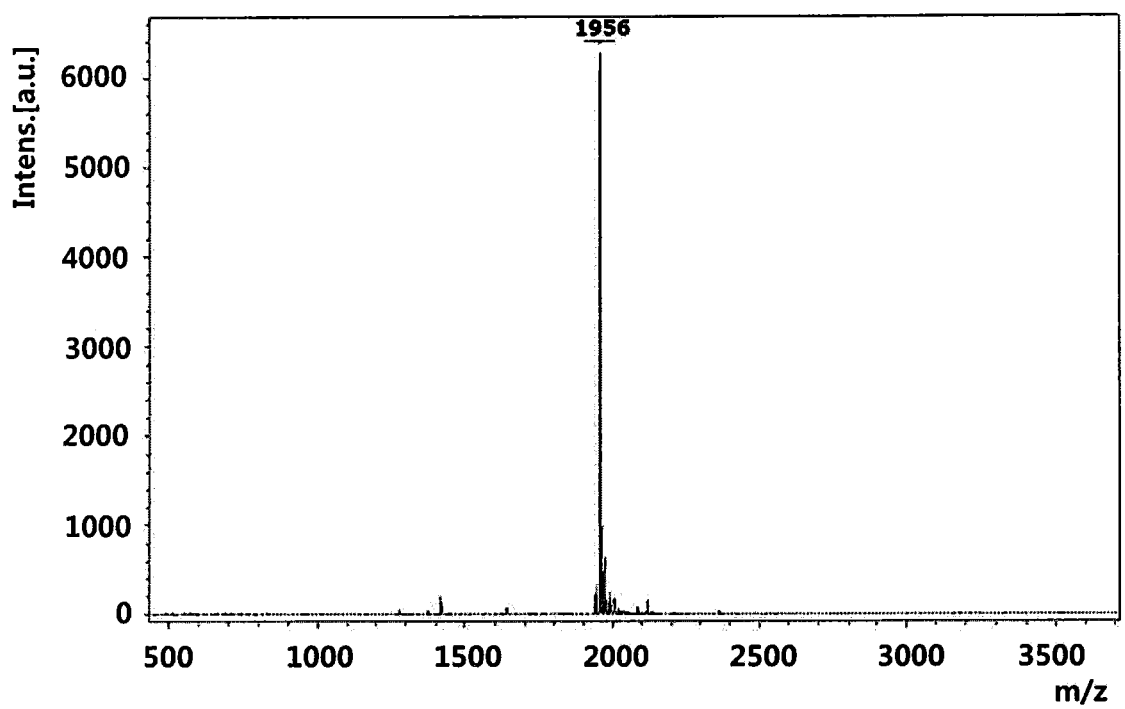
FIG. 3 is a view illustrating an MS spectrum of Compound 1-1-1.

FIG. 3 is a view illustrating an MS spectrum of Compound 1-1-1.

Figure 4:
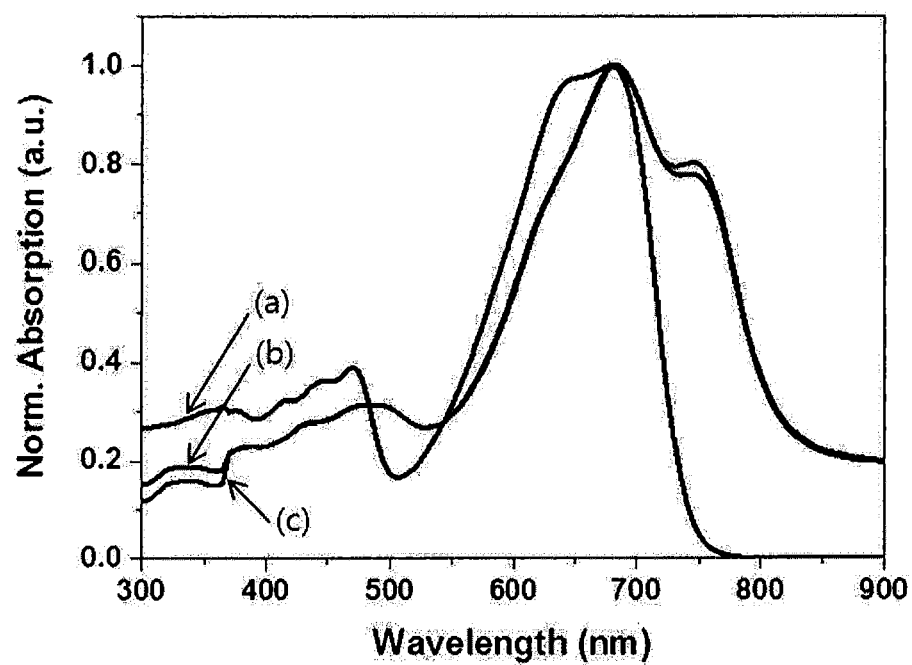
FIG. 4 is a view illustrating a measurement result of UV of Compound 1.

FIG. 4 is a view illustrating a measurement result of UV of Compound 1.

In FIG. 4, (a) is UV data which were measured from Compound 1 in a solution state, (b) is UV data which were measured from Compound 1 in a film state, and (c) is UV data which were measured from Compound 1 after being subjected to a heat treatment at 110° C. for 10 minutes in a film state.

In this case, the solution state is a state in which Compound 1 is dissolved in a chlorobenzene solution, and the film was formed from Compound 1 in a solution state by a spin-coating method.

Figure 5:
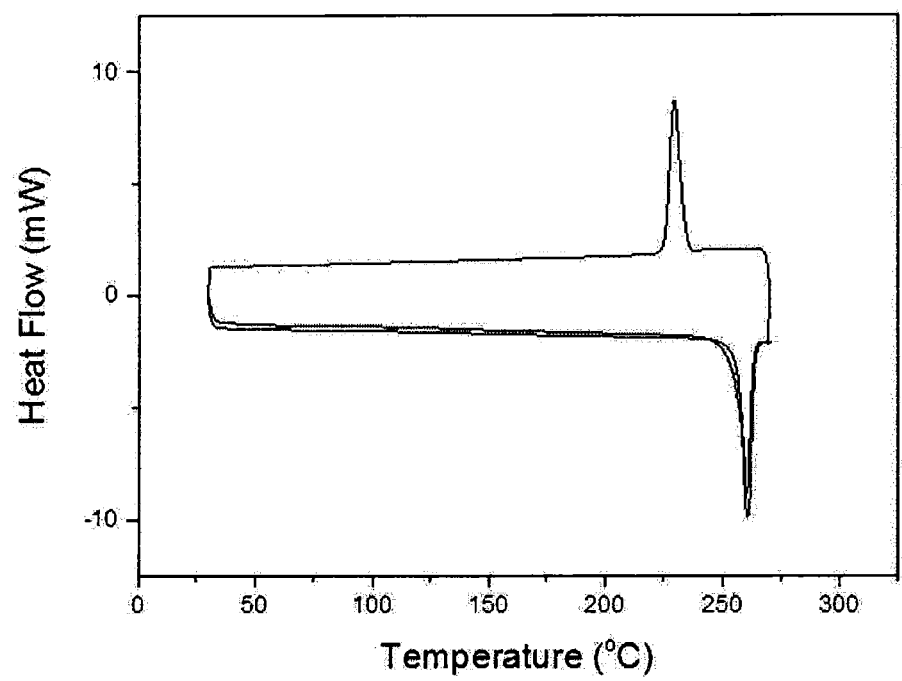
FIG. 5 is a view illustrating a measurement result of DSC of Compound 1.

FIG. 5 is a view illustrating a measurement result of DSC of Compound 1.

Preparation Example 2. Production of Copolymer B
(Non-Crystalline Polymer Material)

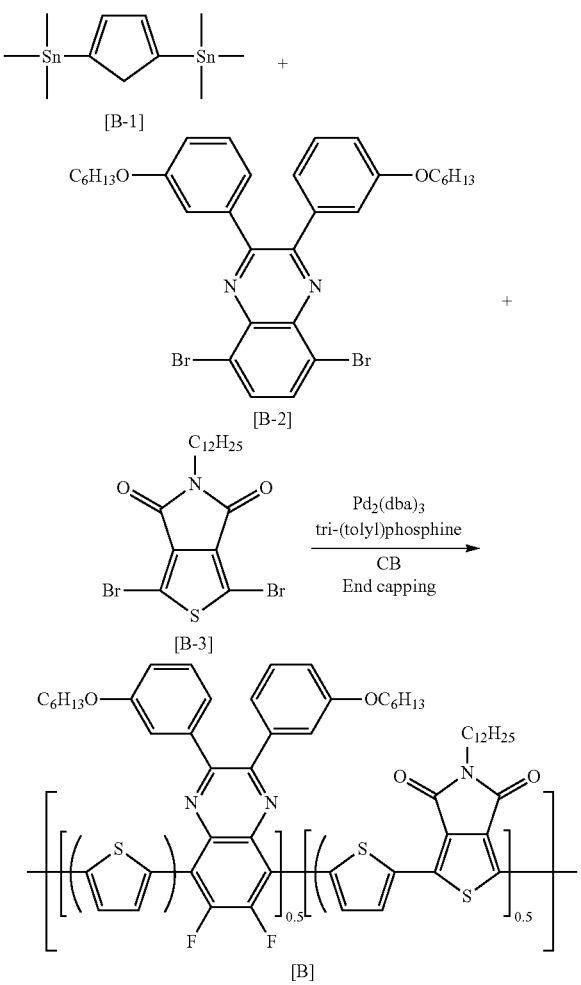

13 ml of chlorobenzene, Compound B-1 (1.2 g, 2.92 mmol), Compound B-2 (0.9905 g, 1.46 mmol), Compound B-3 (0.7018 g, 1.46 mmol), 80 mg of tris(dibenzylideneacetone)dipalladium(0) (Pd$_2$(dba)$_3$), and 106 mg of tri-(o-tolyl)phosphine were put into a microwave reactor vial, and the resulting mixture was allowed to react under a condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out. (Yield: 60%, Number average molecular weight: 26,300 g/mol, and Weight average molecular weight: 78,300 g/mol)

Figure 6:
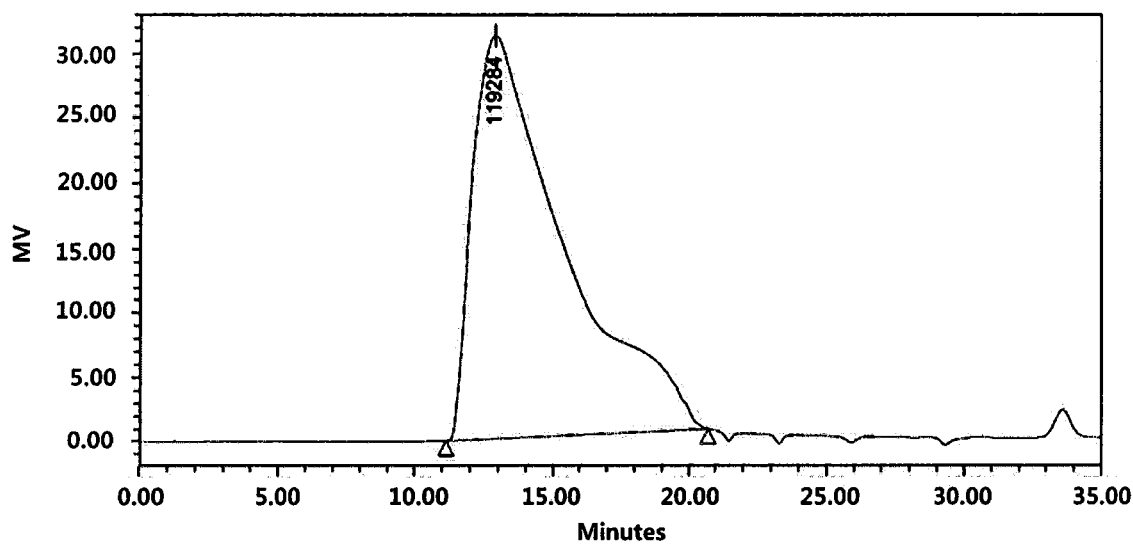
FIG. 6 is a view illustrating gel permeation chromatography (GPC) for Copolymer B.

FIG. 6 is a view illustrating gel permeation chromatography (GPC) for Copolymer B produced in Preparation Example 2.

Preparation Example 3. Production of Copolymer C
(Crystalline Polymer Material)

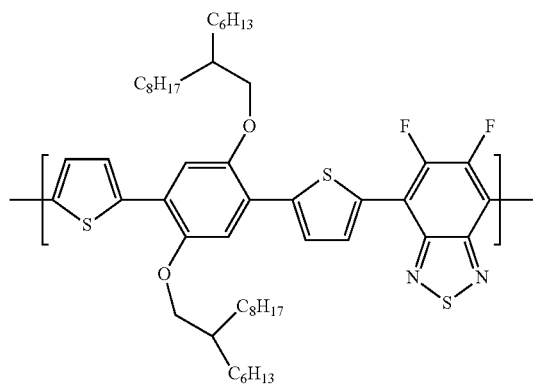

[C]

Copolymer C was produced by the method described in Energy Environ. Sci., 2014, 7, 3040.

Example 1

A glass substrate coated with ITO was washed with a detergent, IPA, and acetone in this order, and dried at 80° C. for 12 hours. Thereafter, a UV ozone treatment was performed for 10 minutes, and then a substrate coated with ZnO was prepared by coating a ZnO sol-gel precursor at 4,000 rpm and performing a heat treatment at 200° C. for 1 hour. The ZnO sol-gel precursor was synthesized as follows. 1 g of zinc acetate dihydrate (Zn(CH$_3$COO)$_2$.2H$_2$O, Aldrich, 99.999%) was dissolved in 0.275 ml of ethanolamine (NH$_2$CH$_2$CH$_2$OH, Aldrich, 99.5%), 10 mL of 2-methoxyethanol (CH$_3$OCH$_2$CH$_2$OH, Aldrich, 99.8%) was mixed with the resulting solution, and the resulting mixture was stirred for 12 hours. A photoactive layer was prepared as follows. Mixed Solution 1 was produced by dissolving Compound 1 and PC$_{71}$BM (Compound 1:PC$_{71}$BM=1:1.5 (wt %)) at a concentration of 10 mg/ml in chlorobenzene (CB). Further, Mixed Solution 2 was produced by dissolving Copolymer B and PC$_{71}$BM (Copolymer B:PC$_{71}$BM=3:2 (wt %)) at a concentration of 33 mg/ml in CB. Mixed Solution 3 was produced by stirring each solution at 80° C. for 5 hours or more, mixing the two stirred solutions at a ratio of Mixed Solution 1:Mixed Solution 2=95:5 (vol %), and further stirring the mixture at 80° C. for 1 hour. Thereafter, a photoactive layer was manufactured by spin-coating a substrate coated with ZnO with Mixed Solution 3 at 1,500 rpm and performing a heat treatment at 80° C. for 30 minutes. Thereafter, 10 nm of molybdenum oxide (MoO$_3$) and 100 nm of an Ag electrode were each thermally deposited under 3.0×10$^{-6}$ torr or less.

Figure 7:
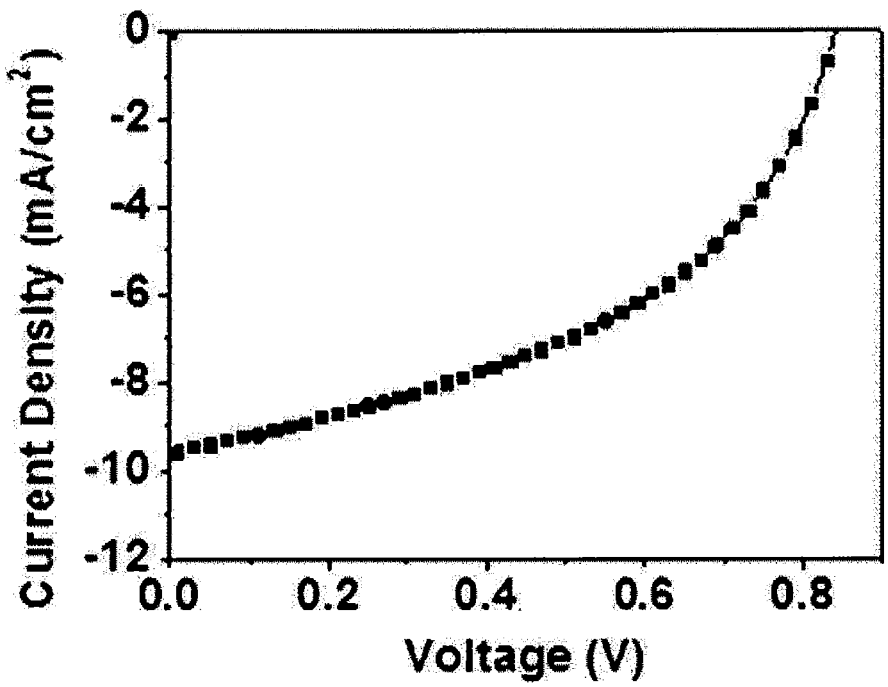
FIG. 7 is a view illustrating the current density according to the voltage with respect to an organic solar cell manufactured in Example 1.

FIG. 7 is a view illustrating the current density according to the voltage with respect to an organic solar cell manufactured in Example 1.

Figure 8:
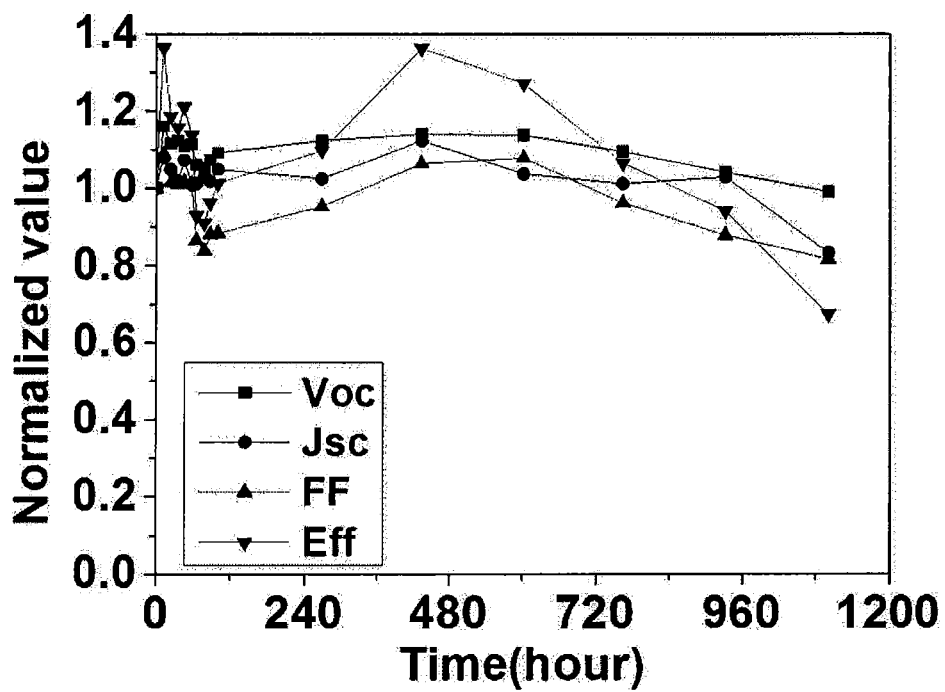
FIG. 8 is a view illustrating a long-term stability evaluation result at room temperature with respect to the organic solar cell manufactured in Example 1.

FIG. 8 is a view illustrating a long-term stability evaluation result at room temperature with respect to the organic solar cell manufactured in Example 1.

The long-term stability at room temperature was evaluated by storing the organic solar cell at room temperature (20 to 30° C.) and measuring the performance at each predetermined time.

Example 2

An organic solar cell was manufactured in the same manner as in Example 1, except that in the preparation method in Example 1, Mixed Solution 1 and Mixed Solution 2 were introduced at a ratio of Mixed Solution 1:Mixed Solution 2=90:10 (vol %).

Figure 9:
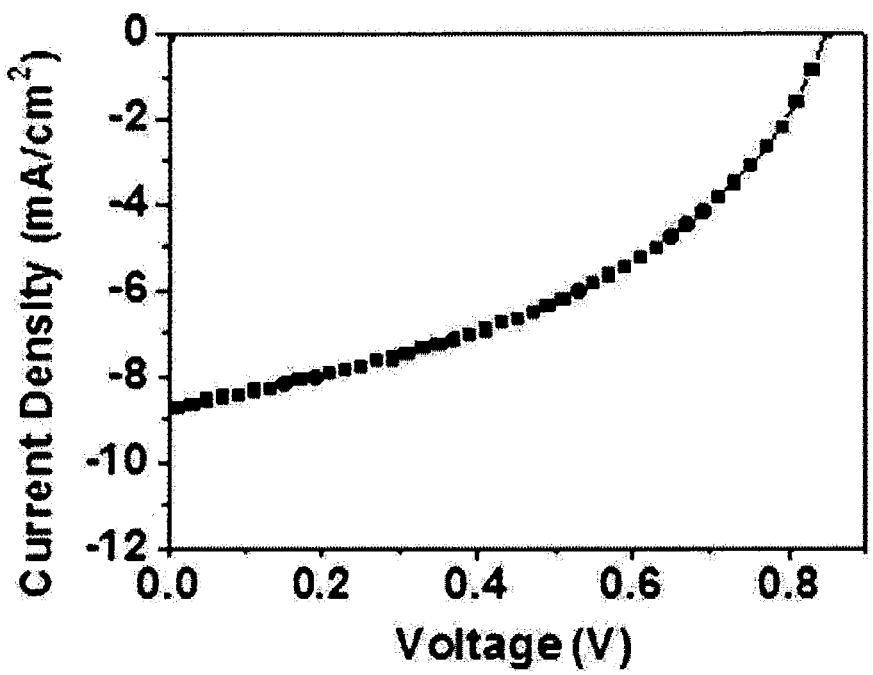
FIG. 9 is a view illustrating the current density according to the voltage with respect to an organic solar cell manufactured in Example 2.

FIG. 9 is a view illustrating the current density according to the voltage with respect to the organic solar cell manufactured in Example 2.

Example 3

A glass substrate coated with ITO was washed with a detergent, IPA, and acetone in this order, and dried at 80° C. for 12 hours. Thereafter, a UV ozone treatment was performed for 10 minutes, and then a substrate coated with ZnO was prepared by coating a ZnO sol-gel precursor at 4,000 rpm and performing a heat treatment at 200° C. for 1 hour. The ZnO sol-gel precursor was synthesized as follows. 1 g of zinc acetate dihydrate (Zn(CH$_3$COO)$_2$.2H$_2$O, Aldrich, 99.999%) was dissolved in 0.275 ml of ethanolamine (NH$_2$CH$_2$CH$_2$OH, Aldrich, 99.5%), 10 mL of 2-methoxyethanol (CH$_3$OCH$_2$CH$_2$OH, Aldrich, 99.8%) was mixed with the resulting solution, and the resulting mixture was stirred for 12 hours. A photoactive layer was prepared as follows. Mixed Solution 4 was produced by dissolving Compound 1 and PC$_{71}$BM (Compound 1:PC$_{71}$BM=1:1.5 (wt %)) at a concentration 10 mg/ml in a solvent obtained by mixing 12 vol % of diiodooctane (DIO) with 88 vol % of CB. Further, Mixed Solution 5 in which Copolymer B and PC$_{71}$BM (Copolymer B:PC$_{71}$BM=1:1 (wt %)) were dissolved at a concentration of 33 mg/ml in the same solvent was produced. Mixed Solution 6 was produced by stirring each solution at 80° C. for 5 hours or more, mixing the two stirred solutions at a ratio of Mixed Solution 4:Mixed Solution 5=95:5 (vol %), and further stirring the mixture at 80° C. for 1 hour. Thereafter, a photoactive layer was manufactured by spin-coating a substrate coated with ZnO with Mixed Solution 6 at 1,500 rpm and performing a heat treatment at 80° C. for 30 minutes. Thereafter, 10 nm of molybdenum oxide (MoO$_3$) and 100 nm of an Ag electrode were each thermally deposited under 3.0×10$^{-6}$ torr or less.

Figure 10:
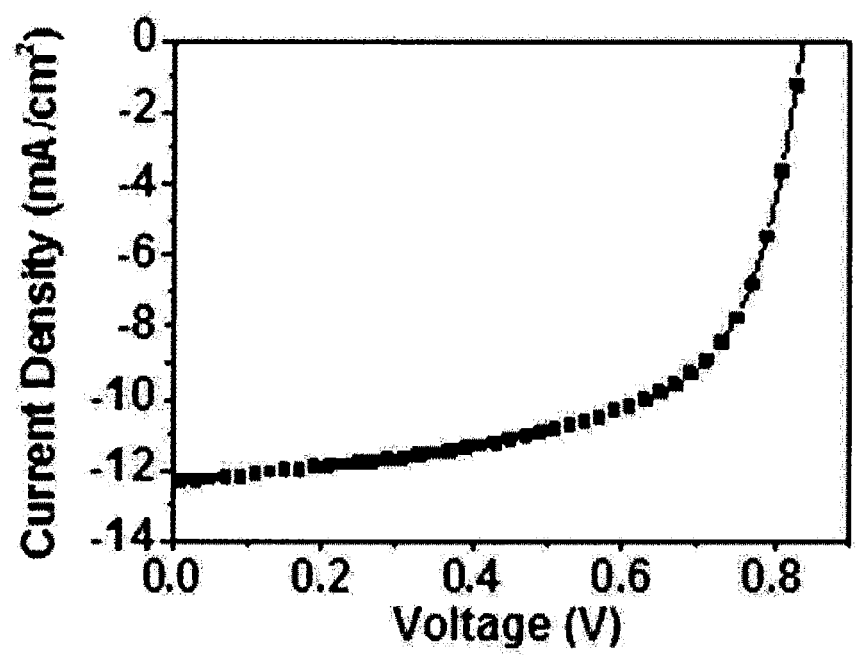
FIG. 10 is a view illustrating the current density according to the voltage with respect to an organic solar cell manufactured in Example 3.

FIG. 10 is a view illustrating the current density according to the voltage with respect to the organic solar cell manufactured in Example 3.

Comparative Example 1

A glass substrate coated with ITO was washed with a detergent, IPA, and acetone in this order, and dried at 80° C. for 12 hours. Thereafter, a UV ozone treatment was performed for 10 minutes, and then a substrate coated with ZnO was prepared by coating a ZnO sol-gel precursor at 4,000 rpm and performing a heat treatment at 200° C. for 1 hour. The ZnO sol-gel precursor was synthesized as follows. 1 g of zinc acetate dihydrate ($Zn(CH_3COO)_2 \cdot 2H_2O$, Aldrich, 99.999%) was dissolved in 0.275 ml of ethanolamine ($NH_2CH_2CH_2OH$, Aldrich, 99.5%), 10 mL of 2-methoxy-ethanol ($CH_3OCH_2CH_2OH$, Aldrich, 99.8%) was mixed with the resulting solution, and the resulting mixture was stirred for 12 hours. A photoactive layer was prepared as follows. Mixed Solution 7 was produced by dissolving Compound 1 and $PC_{71}BM$ (Compound 1:$PC_{71}BM$=1:1.5 (wt %)) at a concentration of 10 mg/ml in CB. Thereafter, a photoactive layer was manufactured by spin-coating a substrate coated with ZnO with Mixed Solution 7 at 1,500 rpm and performing a heat treatment at 80° C. for 30 minutes. Thereafter, 10 nm of molybdenum oxide ($MoO_3$) and 100 nm of an Ag electrode were each thermally deposited under $3.0 \times 10^{-6}$ torr or less.

Figure 11:
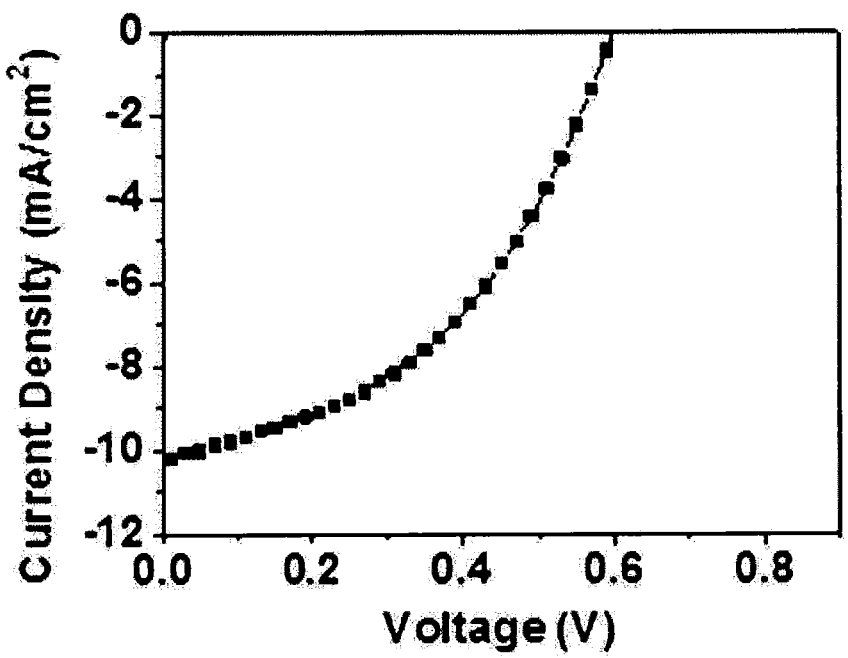
FIG. 11 is a view illustrating the current density according to the voltage with respect to an organic solar cell manufactured in Comparative Example 1.

FIG. 11 is a view illustrating the current density according to the voltage with respect to the organic solar cell manufactured in Comparative Example 1.

Figure 12:
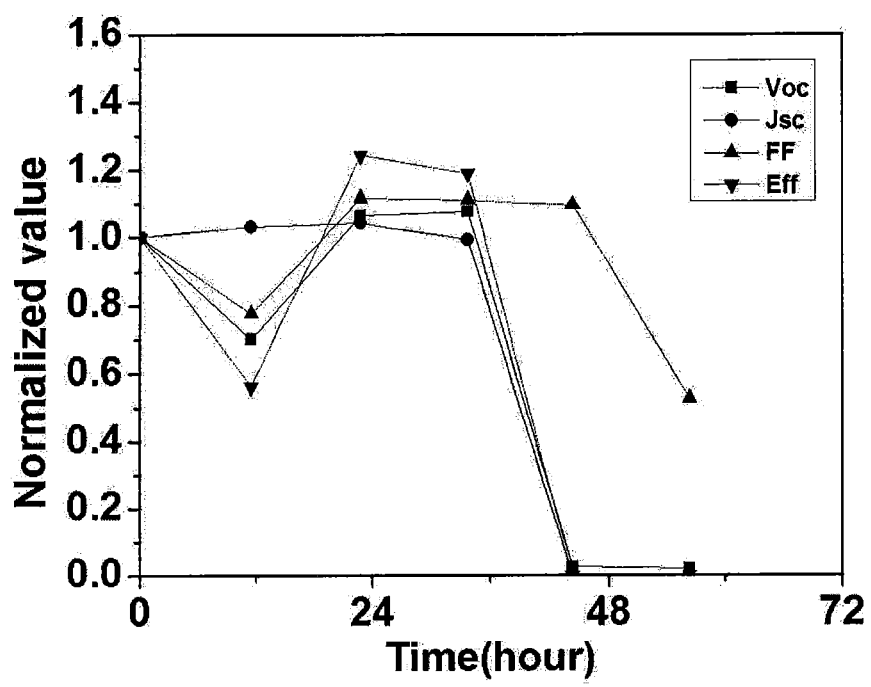
FIG. 12 is a view illustrating a long-term stability evaluation result at room temperature with respect to the organic solar cell manufactured in Comparative Example 1.

FIG. 12 is a view illustrating a long-term stability evaluation result at room temperature with respect to the organic solar cell manufactured in Comparative Example 1.

Photoelectric conversion characteristics of the organic solar cells manufactured in Example 1 to 3 and Comparative Example 1 were measured under the condition of 100 mW/cm² (AM 1.5). Light having a wavelength of 455 nm or less was blocked by using a film capable of blocking UV when the organic solar cell was exposed to light.

Specifically, Table 1 shows a result of measuring the performance immediately after the organic solar cells manufactured in Examples 1 to 3 and Comparative Example 1 were manufactured, respectively, and FIGS. 7, 9, and 11 show results of measuring the current density according to the voltage immediately after the organic solar cells manufactured in Example 1, Example 2, and Comparative Example 1 were manufactured, respectively. Table 2 and FIG. 8 show results of normalizing the change in performance according to the time at room temperature with respect to the organic solar cell manufactured in Example 1. Table 3 and FIG. 12 show results of normalizing the change in performance according to the time at room temperature with respect to the organic solar cell manufactured in Comparative Example 1.

TABLE 1

|  | $V_{oc}$ (V) | $J_{sc}$ (mA/cm²) | FF | η (%) |
|---|---|---|---|---|
| Example 1 | 0.84 | 9.62 | 0.45 | 3.67 |
| Example 2 | 0.85 | 8.74 | 0.43 | 3.22 |
| Example 3 | 0.84 | 12.35 | 0.62 | 6.43 |
| Comparative Example 1 | 0.60 | 10.25 | 0.44 | 2.71 |

In Table 1, $V_{oc}$, $J_{sc}$, FF, and η mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

TABLE 2

| Time | $V_{oc}$ | $J_{sc}$ | FF | η |
|---|---|---|---|---|
| 0 | 1 | 1 | 1 | 1 |
| 11 hours | 1.16 | 1.08 | 1.09 | 1.36 |
| 23 hours | 1.12 | 1.05 | 1.01 | 1.19 |
| 34 hours | 1.12 | 1.02 | 1.01 | 1.16 |
| 44 hours | 1.11 | 1.07 | 1.02 | 1.21 |
| 56 hours | 1.11 | 1.01 | 1.01 | 1.14 |
| 64 hours | 1.06 | 1.01 | 0.87 | 0.93 |
| 77 hours | 1.05 | 1.03 | 0.84 | 0.91 |
| 87 hours | 1.07 | 1.02 | 0.88 | 0.96 |
| 99 hours | 1.09 | 1.05 | 0.88 | 1.01 |
| 268 hours | 1.12 | 1.02 | 0.95 | 1.10 |
| 435 hours | 1.14 | 1.12 | 1.06 | 1.36 |
| 602 hours | 1.14 | 1.04 | 1.08 | 1.7 |
| 764 hours | 1.09 | 1.01 | 0.96 | 1.06 |
| 914 hours | 1.04 | 1.03 | 0.88 | 0.94 |

TABLE 3

| Time | $V_{oc}$ | $J_{sc}$ | FF | η |
|---|---|---|---|---|
| 0 | 1 | 1 | 1 | 1 |
| 11 hours | 0.70 | 1.03 | 0.78 | 0.56 |
| 23 hours | 1.07 | 1.04 | 1.12 | 1.24 |
| 34 hours | 1.08 | 0.99 | 1.11 | 1.19 |
| 44 hours | 0.03 | 0.00 | 1.10 | 0.00 |
| 56 hours | 0.02 | 0.00 | 0.53 | 0.00 |
| 64 hours | 0.17 | 0.00 | 1.83 | 0.00 |

From Tables 1 to 3, it can be confirmed that Examples 1 to 3 in which a single molecular material and a non-crystalline polymer material as electron donors were introduced into the photoactive layer were excellent in efficiency and stability as compared to Comparative Example 1 in which the single molecular material as an electron donor was alone introduced into the photoactive layer. In particular, the performance of Example 3 in which an additive was introduced was excellent in terms of efficiency. In addition, it can be confirmed that in terms of stability, the performance of Comparative Example 1 sharply deteriorated after 44 hours, whereas 90% or more of the performance of Example 1 was maintained even though 900 hours elapsed, so that the stability was excellent.

Example 4

A glass substrate coated with ITO was washed with a detergent, IPA, and acetone in this order, and dried at 80° C. for 12 hours. Thereafter, a UV ozone treatment was performed for 10 minutes, and then a substrate coated with ZnO was prepared by coating a ZnO sol-gel precursor at 4,000 rpm and performing a heat treatment at 200° C. for 1 hour. The ZnO sol-gel precursor was synthesized as follows. 1 g of zinc acetate dihydrate ($Zn(CH_3COO)_2 \cdot 2H_2O$, Aldrich, 99.999%) was dissolved in 0.275 ml of ethanolamine ($NH_2CH_2CH_2OH$, Aldrich, 99.5%), 10 mL of 2-methoxy-ethanol ($CH_3OCH_2CH_2OH$, Aldrich, 99.8%) was mixed with the resulting solution, and the resulting mixture was stirred for 12 hours. A photoactive layer was prepared as follows. Mixed Solution 8 was produced by dissolving Compound 1 and $PC_{71}BM$ (Compound 1:$PC_{71}BM$=1:1.5 (wt %)) at a concentration of 10 mg/ml in a solvent obtained by mixing 12 vol % of diiodooctane (DIO) with 88 vol % of CB. Further, Mixed Solution 9 in which Copolymer C and PC$_{71}$BM (Copolymer C:PC$_{71}$BM=1:1 (wt %)) were dissolved at a concentration of 33 mg/ml in the same solvent was produced. Mixed Solution 10 was produced by stirring each solution at 80° C. for 5 hours or more, mixing the two stirred solutions at a ratio of Mixed Solution 8:Mixed Solution 9=95:5 (vol %), and further stirring the mixture at 80° C. for 1 hour. Thereafter, a photoactive layer was manufactured by spin-coating a substrate coated with ZnO with Mixed Solution 10 at 1,500 rpm and performing a heat treatment at 80° C. for 30 minutes. Thereafter, 10 nm of molybdenum oxide (MoO$_3$) and 100 nm of an Ag electrode were each thermally deposited under 3.0×10$^{-6}$ torr or less.

Figure 13:
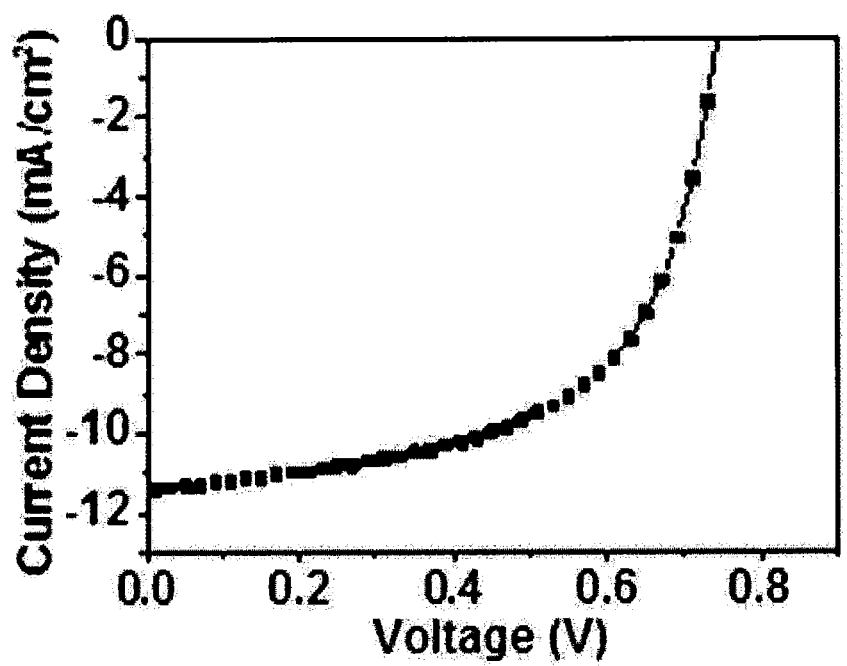
FIG. 13 is a view illustrating the current density according to the voltage with respect to an organic solar cell manufactured in Example 4.

FIG. 13 is a view illustrating the current density according to the voltage with respect to an organic solar cell manufactured in Example 4.

Figure 14:
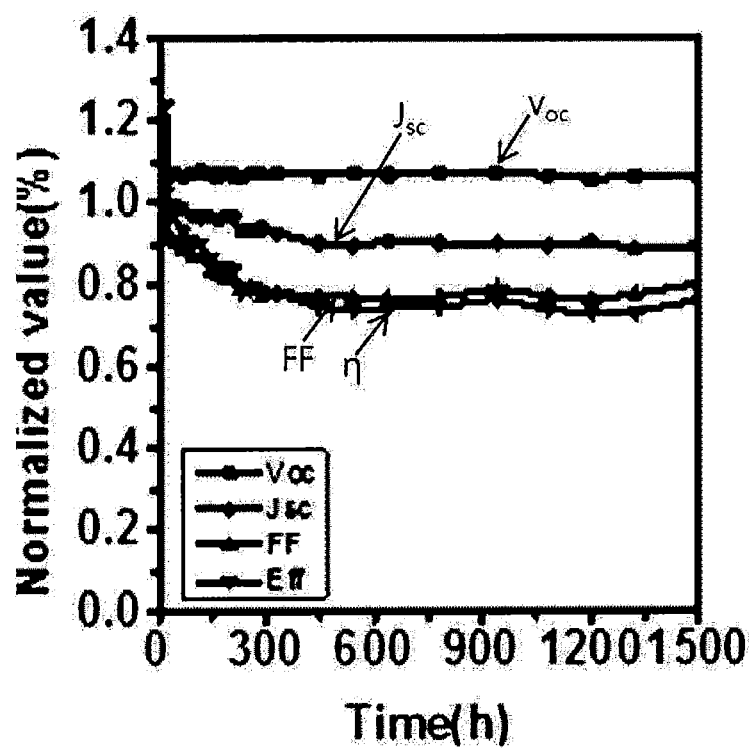
FIG. 14 is a view illustrating a long-term stability evaluation result at room temperature with respect to the organic solar cell manufactured in Example 4.

FIG. 14 is a view illustrating a long-term stability evaluation result at room temperature with respect to the organic solar cell manufactured in Example 4.

Figure 15:
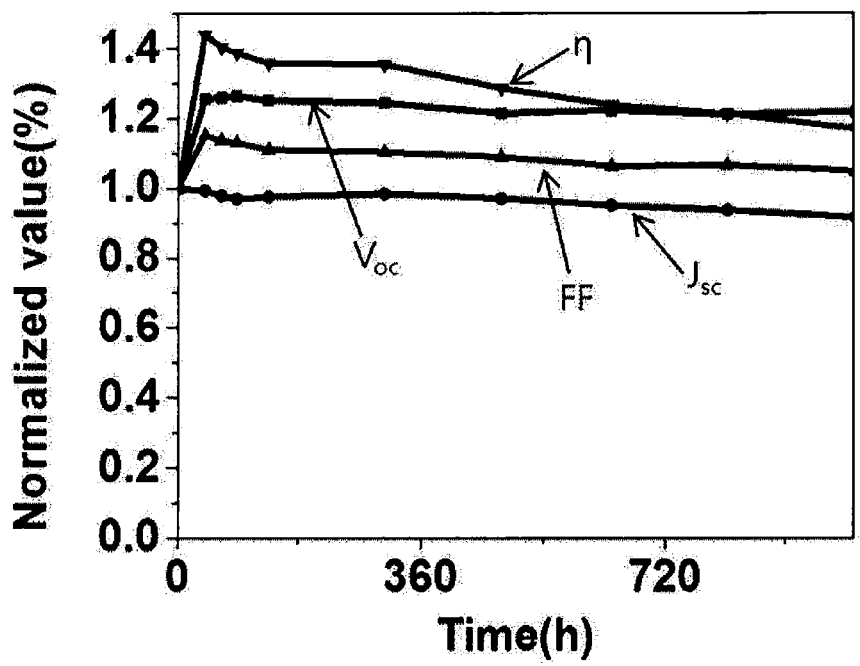
FIG. 15 is a view illustrating a long-term stability evaluation result at high temperature with respect to the organic solar cell manufactured in Example 4.

FIG. 15 is a view illustrating a long-term stability evaluation result at high temperature with respect to the organic solar cell manufactured in Example 4.

The long-term stability at high temperature was confirmed by storing the manufactured organic solar cell at 80° C. and measuring the performance at each predetermined time.

Example 5

An organic solar cell was manufactured in the same manner as in Example 4, except that in Example 4, Copolymer D having the following structure was used instead of Copolymer C.

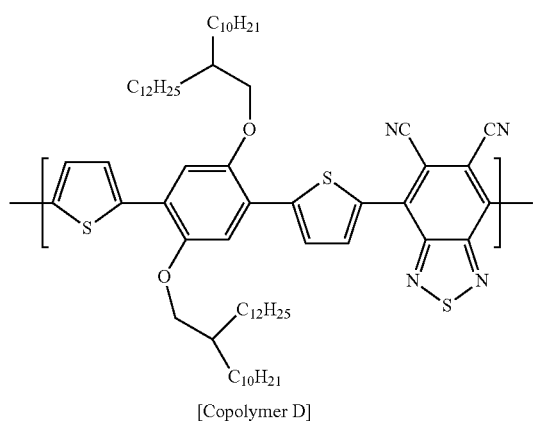

[Copolymer D]

Figure 16:
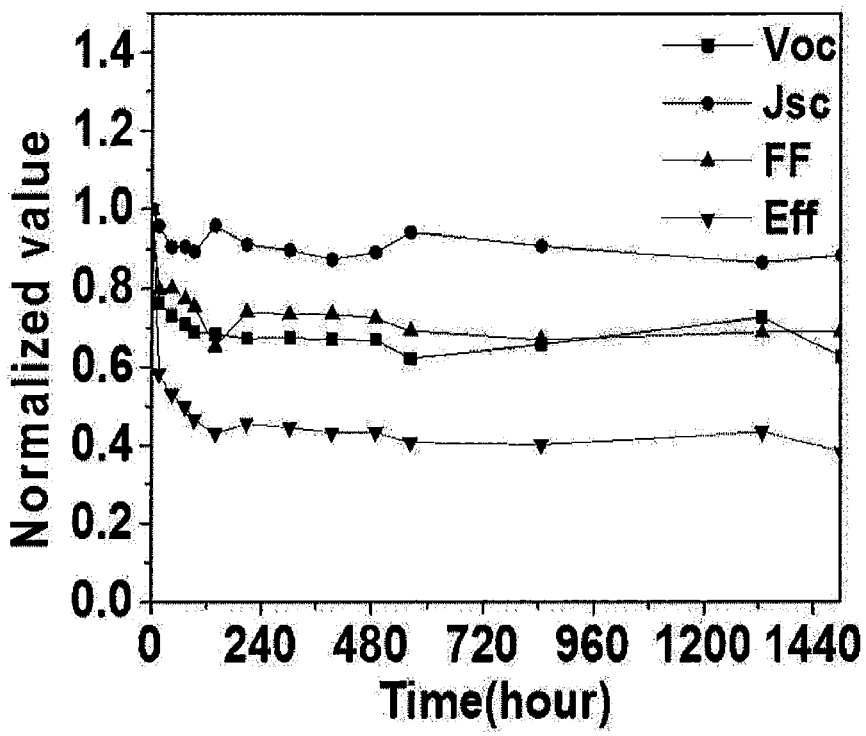
FIG. 16 is a view illustrating a long-term stability evaluation result at room temperature with respect to an organic solar cell manufactured in Example 5.

FIG. 16 is a view illustrating a long-term stability evaluation result at room temperature with respect to the organic solar cell manufactured in Example 5.

Figure 17:
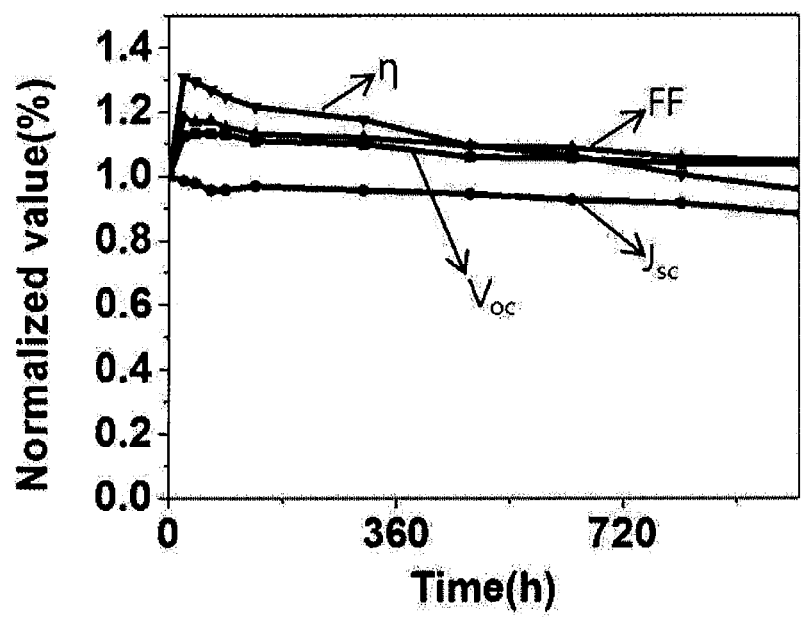
FIG. 17 is a view illustrating a long-term stability evaluation result at high temperature with respect to the organic solar cell manufactured in Example 5.

FIG. 17 is a view illustrating a long-term stability evaluation result at high temperature with respect to the organic solar cell manufactured in Example 5.

Example 6

An organic solar cell was manufactured in the same manner as in Example 4, except that in Example 4, Copolymer E having the following structure was used instead of Copolymer C.

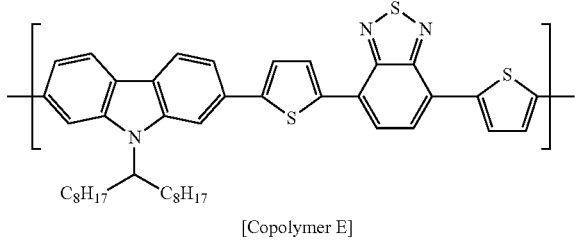

[Copolymer E]

Figure 18:
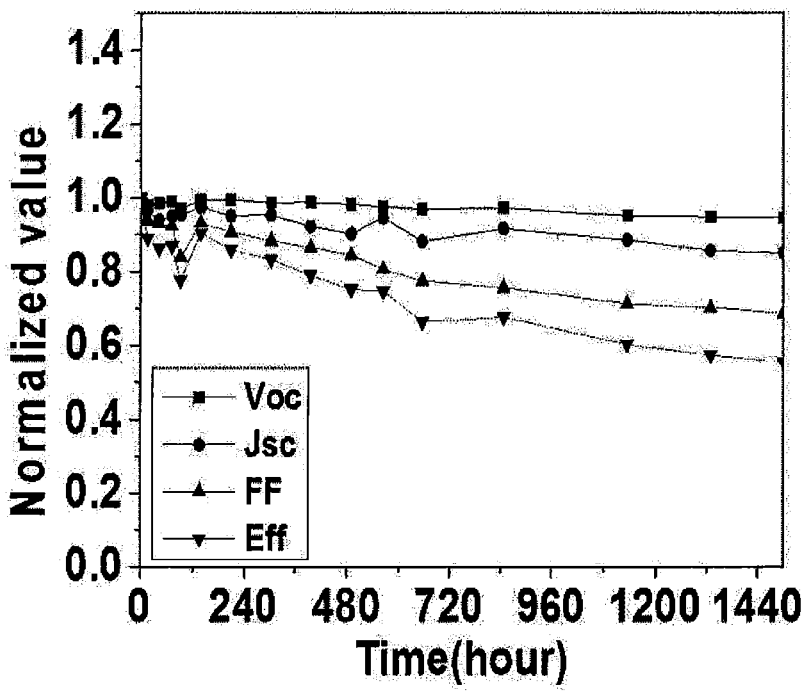
FIG. 18 is a view illustrating a long-term stability evaluation result at room temperature with respect to an organic solar cell manufactured in Example 6.

FIG. 18 is a view illustrating a long-term stability evaluation result at room temperature with respect to the organic solar cell manufactured in Example 6.

Comparative Example 2

A glass substrate coated with ITO was washed with a detergent, IPA, and acetone in this order, and dried at 80° C. for 12 hours. Thereafter, a UV ozone treatment was performed for 10 minutes, and then a substrate coated with ZnO was prepared by coating a ZnO sol-gel precursor at 4,000 rpm and performing a heat treatment at 200° C. for 1 hour. The ZnO sol-gel precursor was synthesized as follows. 1 g of zinc acetate dihydrate (Zn(CH$_3$COO)$_2$.2H$_2$O, Aldrich, 99.999%) was dissolved in 0.275 ml of ethanolamine (NH$_2$CH$_2$CH$_2$OH, Aldrich, 99.5%), 10 mL of 2-methoxyethanol (CH$_3$OCH$_2$CH$_2$OH, Aldrich, 99.8%) was mixed with the resulting solution, and the resulting mixture was stirred for 12 hours. A photoactive layer was prepared as follows. Mixed Solution 8 was produced by dissolving Compound 1 and PC$_{71}$BM (Compound 1:PC$_{71}$BM=1:1.5 (wt %)) at a concentration of 10 mg/ml in a solvent obtained by mixing 12 vol % of diiodooctane (DIO) with 88 vol % of CB. Thereafter, a photoactive layer was manufactured by spin-coating a substrate coated with ZnO with Mixed Solution 8 at 1,500 rpm and performing a heat treatment at 80° C. for 30 minutes. Thereafter, 10 nm of molybdenum oxide (MoO$_3$) and 100 nm of an Ag electrode were each thermally deposited under 3.0×10$^{-6}$ torr or less.

Figure 19:
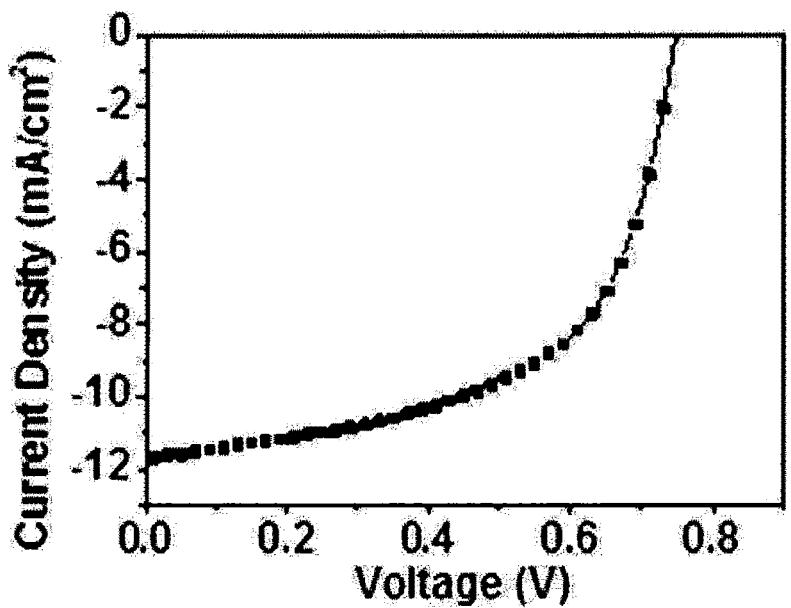
FIG. 19 is a view illustrating the current density according to the voltage with respect to an organic solar cell manufactured in Comparative Example 2.

FIG. 19 is a view illustrating the current density according to the voltage with respect to the organic solar cell manufactured in Comparative Example 2.

Figure 20:
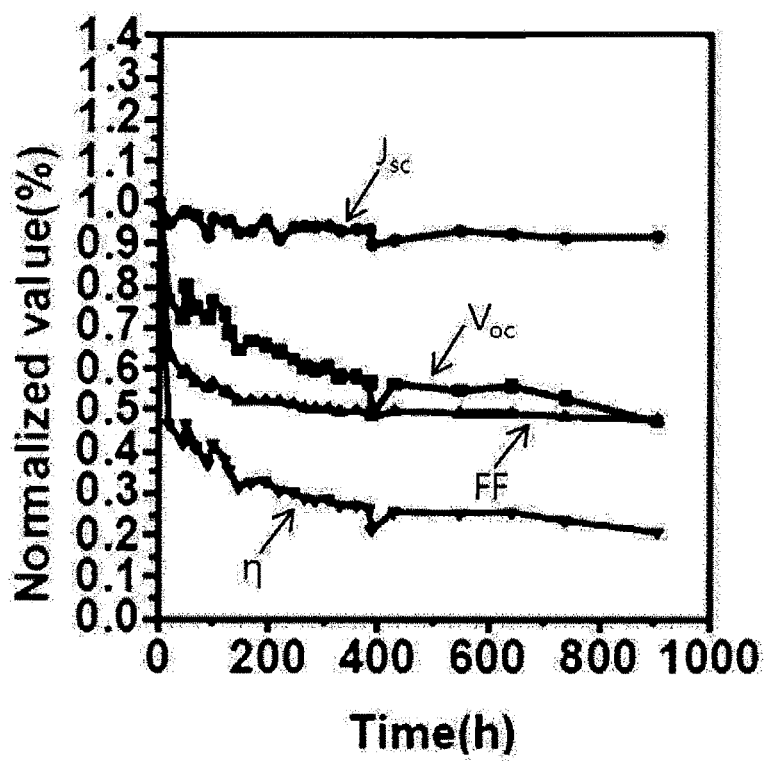
FIG. 20 is a view illustrating a long-term stability evaluation result at room temperature with respect to the organic solar cell manufactured in Comparative Example 2.

FIG. 20 is a view illustrating a long-term stability evaluation result at room temperature with respect to the organic solar cell manufactured in Comparative Example 2.

Photoelectric conversion characteristics of the organic solar cells manufactured in Example 4 and Comparative Example 2 were measured under the condition of 100 mW/cm$^2$ (Am 1.5). Light having a wavelength of 455 nm or less was blocked by using a film capable of blocking UV when the organic solar cell was exposed to light.

Specifically, Table 4 shows a result of measuring the performance immediately after the organic solar cells manufactured in Example 4 and Comparative Example 2 were manufactured. Table 5 and FIG. 14 show results of normalizing the change in performance according to the time at room temperature with respect to the organic solar cell manufactured in Example 4. Table 6 and FIG. 20 show results of normalizing the change in performance according to the time at room temperature with respect to the organic solar cell manufactured in Comparative Example 2.

TABLE 4

|  | $V_{oc}$ (V) | $J_{sc}$ (mA/cm$^2$) | FF | η (%) |
|---|---|---|---|---|
| Example 4 | 0.74 | 11.42 | 0.59 | 5.02 |
| Comparative Example 2 | 0.75 | 11.73 | 0.58 | 5.05 |

In Table 4, $V_{oc}$, $J_{sc}$, FF, and η mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

TABLE 5

| Time | $V_{oc}$ | $J_{sc}$ | FF | η |
|---|---|---|---|---|
| 0 h | 1 | 1 | 1 | 1 |
| 19 hours | 1.12 | 1.04 | 1.07 | 1.24 |
| 43 hours | 1.07 | 1.00 | 0.91 | 0.97 |
| 67 hours | 1.07 | 0.98 | 0.89 | 0.93 |
| 93 hours | 1.07 | 0.97 | 0.87 | 0.91 |
| 144 hours | 1.07 | 0.97 | 0.84 | 0.87 |
| 164 hours | 1.07 | 0.96 | 0.82 | 0.84 |
| 183 hours | 1.07 | 0.97 | 0.82 | 0.85 |
| 228 hours | 1.06 | 0.93 | 0.79 | 0.79 |
| 258 hours | 1.07 | 0.93 | 0.80 | 0.79 |
| 282 hours | 1.07 | 0.93 | 0.79 | 0.79 |
| 286 hours | 1.07 | 0.94 | 0.78 | 0.78 |
| 328 hours | 1.08 | 0.93 | 0.79 | 0.78 |
| 447 hours | 1.07 | 0.90 | 0.78 | 0.75 |
| 541 hours | 1.08 | 0.90 | 0.77 | 0.74 |
| 637 hours | 1.07 | 0.91 | 0.77 | 0.75 |
| 780 hours | 1.07 | 0.90 | 0.77 | 0.75 |
| 942 hours | 1.07 | 0.90 | 0.79 | 0.77 |
| 1,081 hours | 1.07 | 0.90 | 0.77 | 0.74 |
| 1,203 hours | 1.06 | 0.90 | 0.77 | 0.73 |
| 1,323 hours | 1.06 | 0.89 | 0.78 | 0.73 |
| 1,500 hours | 1.06 | 0.90 | 0.80 | 0.76 |

TABLE 6

| Time | $V_{oc}$ | $J_{sc}$ | FF | η |
|---|---|---|---|---|
| 0 h | 1 | 1 | 1 | 1 |
| 18 hours | 0.77 | 0.95 | 0.64 | 0.47 |
| 43 hours | 0.73 | 0.98 | 0.59 | 0.42 |
| 67 hours | 0.75 | 0.97 | 0.57 | 0.41 |
| 98 hours | 0.77 | 0.96 | 0.57 | 0.42 |
| 146 hours | 0.65 | 0.93 | 0.52 | 0.31 |
| 168 hours | 0.67 | 0.93 | 0.52 | 0.33 |
| 194 hours | 0.66 | 0.96 | 0.52 | 0.33 |
| 219 hours | 0.64 | 0.91 | 0.52 | 0.31 |
| 245 hours | 0.62 | 0.94 | 0.51 | 0.30 |
| 285 hours | 0.60 | 0.94 | 0.50 | 0.29 |
| 309 hours | 0.60 | 0.94 | 0.50 | 0.29 |
| 329 hours | 0.58 | 0.93 | 0.50 | 0.27 |
| 359 hours | 0.58 | 0.94 | 0.50 | 0.27 |
| 383 hours | 0.57 | 0.94 | 0.50 | 0.26 |
| 388 hours | 0.49 | 0.90 | 0.48 | 0.21 |
| 429 hours | 0.56 | 0.91 | 0.50 | 0.26 |
| 549 hours | 0.55 | 0.93 | 0.49 | 0.25 |

TABLE 6-continued

| Time | $V_{oc}$ | $J_{sc}$ | FF | η |
|---|---|---|---|---|
| 6,423 hours | 0.56 | 0.93 | 0.49 | 0.25 |
| 739 hours | 0.53 | 0.92 | 0.48 | 0.23 |
| 905 hours | 0.47 | 0.92 | 0.48 | 0.21 |

From Tables 4 to 6, it can be confirmed that the Examples in which the initial efficiency of a single molecular material and a crystalline polymer material as electron donors were introduced into the photoactive layer was similar, but the stability thereof was improved, as compared to Comparative Example 2 in which the single molecular material as an electron donor was alone introduced into the photoactive layer. In particular, it can be confirmed that the performance of Comparative Example 2 deteriorated by 50% or less within 18 hours, whereas 70% or more of the performance of Example 4 was maintained even though 1,500 hours elapsed, so that the stability was excellent.

The long-term stability evaluation results at high temperature with respect to the organic solar cells manufactured in the Examples are shown in Tables 7 and 8 and FIGS. 15 and 17. Specifically, Table 7 and FIG. 15 show results of normalizing the change in performance according to the time at high temperature (80° C.) with respect to the organic solar cell manufactured in Example 4. Table 8 and FIG. 17 show results of normalizing the change in performance according to the time at high temperature (80° C.) with respect to the organic solar cell manufactured in Example 5.

TABLE 7

| Time | $V_{oc}$ | $J_{sc}$ | FF | η |
|---|---|---|---|---|
| 0 h | 1 | 1 | 1 | 1 |
| 41 hours | 1.26 | 0.99 | 1.15 | 1.44 |
| 65 hours | 1.26 | 0.98 | 1.14 | 1.40 |
| 88 hours | 1.26 | 0.97 | 1.13 | 1.39 |
| 136 hours | 1.25 | 0.98 | 1.11 | 1.36 |
| 307 hours | 1.24 | 0.98 | 1.10 | 1.35 |
| 477 hours | 1.21 | 0.97 | 1.09 | 1.29 |
| 640 hours | 1.22 | 0.95 | 1.06 | 1.24 |
| 811 hours | 1.21 | 0.94 | 1.07 | 1.21 |
| 1,003 hours | 1.22 | 0.92 | 1.05 | 1.17 |

TABLE 8

| Time | $V_{oc}$ | $J_{sc}$ | FF | η |
|---|---|---|---|---|
| 0 h | 1 | 1 | 1 | 1 |
| 41 hours | 1.13 | 0.98 | 1.17 | 1.29 |
| 65 hours | 1.13 | 0.96 | 1.17 | 1.27 |
| 88 hours | 1.13 | 0.96 | 1.15 | 1.25 |
| 136 hours | 1.11 | 0.97 | 1.13 | 1.22 |
| 307 hours | 1.10 | 0.96 | 1.12 | 1.18 |
| 477 hours | 1.06 | 0.94 | 1.09 | 1.09 |
| 640 hours | 1.05 | 0.93 | 1.09 | 1.06 |
| 811 hours | 1.04 | 0.92 | 1.06 | 1.00 |
| 1,003 hours | 1.04 | 0.88 | 1.05 | 0.96 |

From Tables 7 and 8 and FIGS. 15 and 17, it can be confirmed that the organic solar cell according to an exemplary embodiment of the present specification maintains the performance even at high temperature for more than 1,000 hours. That is, it can be confirmed that the organic solar cell according to an exemplary embodiment of the present specification exhibits high-temperature stability.

What is claimed is:

1. A photoactive layer comprising:
an electron donor; and
an electron acceptor, wherein the electron donor comprises a single molecular material and a polymer material, wherein a content of the single molecular material in the electron donor is higher than a content of the polymer material and a volume ratio of the single molecular material to the polymer material is 99:1 to 51:49, and wherein the single molecular material is a compound of Formula 1:

[Formula 1]

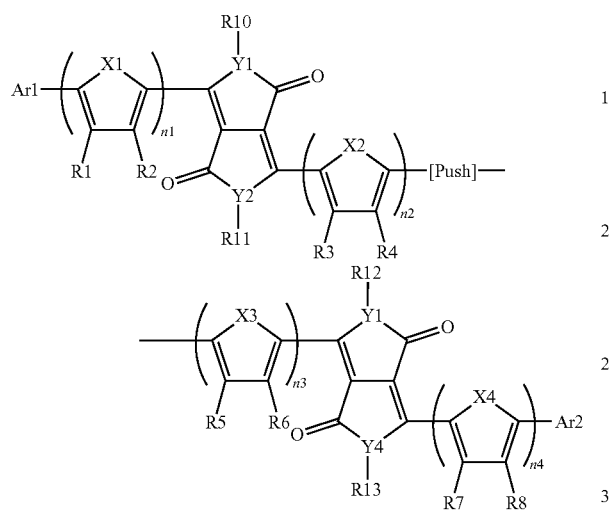

wherein:

n1 to n4 are each an integer from 1 to 3;

when n1 to n4 are each 2 or more, two or more structures in the parenthesis are the same as or different from each other;

X1 to X4 are the same as or different from each other, and are each independently $CR_aR_b$, $NR_a$, O, $SiR_aR_b$, $PR_a$, S, $GeR_aR_b$, Se, or Te;

Y1 to Y4 are the same as or different from each other, and are each independently $CR_c$, N, $SiR_c$, P, or $GeR_c$;

R1 to R8, R10 to R13, $R_a$, $R_b$, and $R_c$ are the same as or different from each other, and are each independently hydrogen, deuterium, a halogen group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group;

Ar1 and Ar2 are the same as or different from each other, and are each independently any one of the following structures,

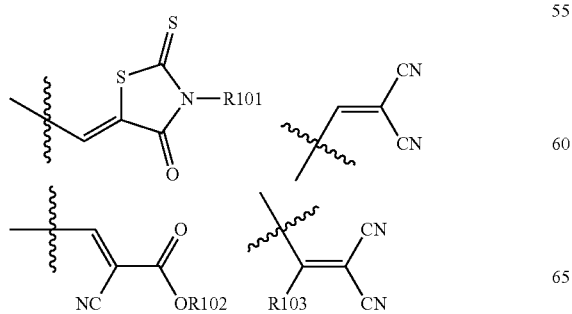

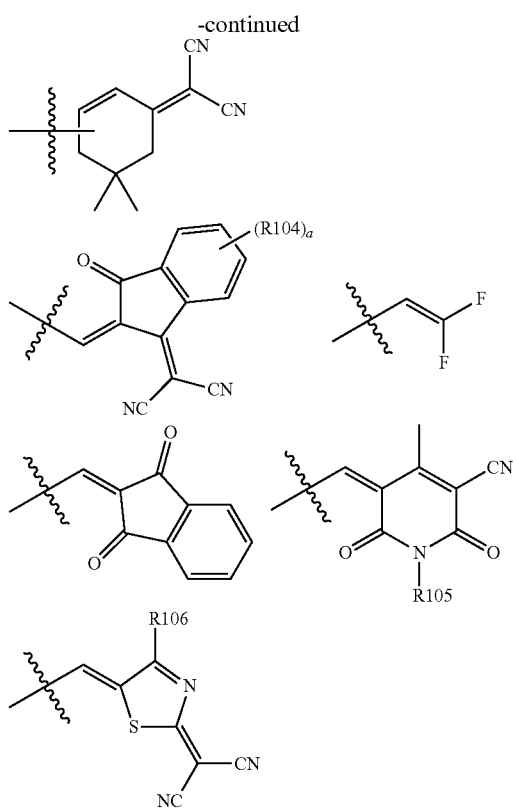

wherein:

a is an integer from 1 to 4;

when a is 2 or more, two or more structures in the parenthesis are the same as or different from each other;

R101 to R106 are the same as or different from each other, and are each independently hydrogen, deuterium, a halogen group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group;

[Push] has a structure which acts as an electron donor, and the structure is one of the following structures,

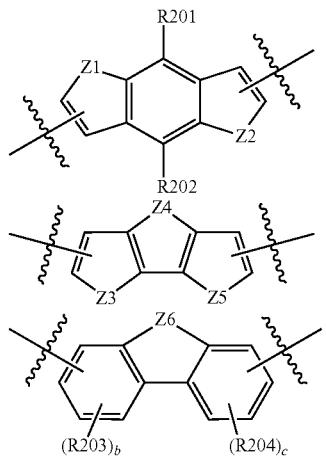

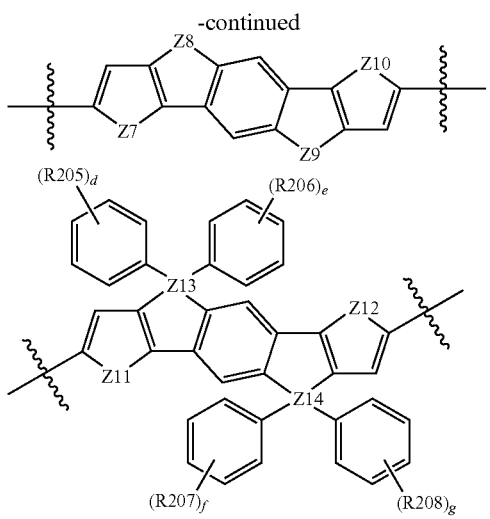

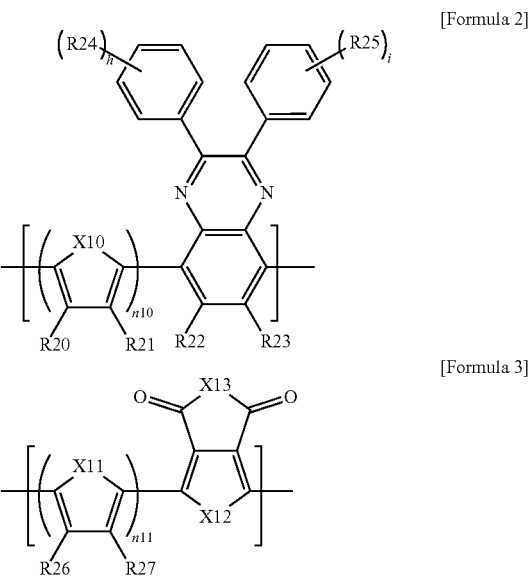

wherein:

b and c are each an integer from 1 to 3;

d, e, f, and g are each an integer from 1 to 5;

when b, c, d, e, f, and g are each 2 or more, two or more structures in the parenthesis are the same as or different from each other;

Z1 to Z12 are the same as or different from each other, and are each independently $CR_dR_e$, $NR_d$, O, $SiR_dR_e$, $PR_d$, S, $GeR_dR_e$, Se, or Te;

Z13 and Z14 are the same as or different from each other, and are each independently C, Si, or Ge; and R201 to R208, $R_d$, and $R_e$ are the same as or different from each other, and are each independently hydrogen, deuterium, a halogen group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group.

2. The photoactive layer of claim 1, wherein the polymer material is a non-crystalline polymer material.

3. The photoactive layer of claim 2, wherein the non-crystalline polymer material comprises a copolymer comprising a first unit of Formula 2 and a second unit of Formula 3:

wherein:

n10 and n11 are each an integer from 1 to 3;

when n10 and n11 are each 2 or more, two or more structures in the parenthesis are the same as or different from each other;

h and i are each an integer from 1 to 5;

when h and i are each 2 or more, two or more structures in the parenthesis are the same as or different from each other;

X10 to X13 are the same as or different from each other, and are each independently $CR_fR_g$, $NR_f$, O, $SiR_fR_g$, $PR_f$, S, $GeR_fR_g$, Se, or Te; and R20 to R27, $R_f$, and $R_g$ are the same as or different from each other, and are each independently hydrogen, deuterium, a halogen group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group.

4. The photoactive layer of claim 1, wherein the polymer material is a crystalline polymer material.

5. The photoactive layer of claim 1, wherein the compound of Formula 1 is a compound of Formula 1-1:

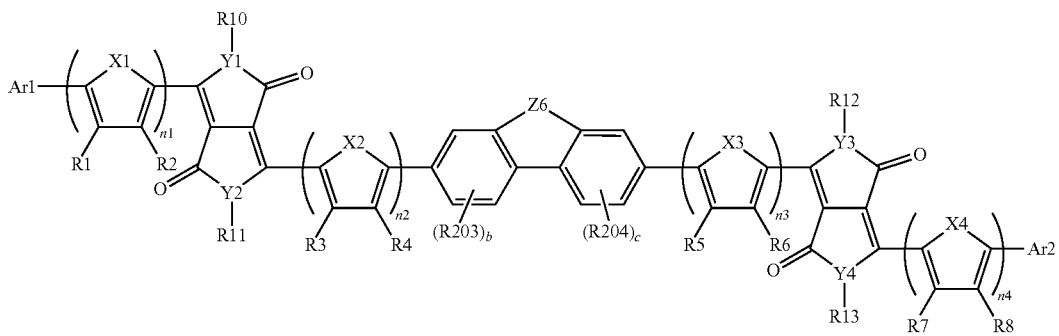

wherein:
n1 to n4, X1 to X4, Y1 to Y4, R1 to R8, R10 to R13, Ar1, and Ar2 are the same as those defined in Formula 1;
$Z6$ is $CR_dR_e$, $NR_d$, O, $SiR_dR_e$, $PR_d$, S, $GeR_dR_e$, Se, or Te;
b and c are each an integer from 1 to 3;
when b and c are each 2 or more, two or more structures in the parenthesis are the same as or different from each other; and
R203, R204, $R_d$, and $R_e$ are the same as or different from each other, and are each independently hydrogen, deuterium, a halogen group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group.

6. The photoactive layer of claim 1, further comprising an additive.

7. The photoactive layer of claim 1, wherein the electron acceptor comprises a fullerene derivative.

8. An organic solar cell comprising:
a first electrode;
a second electrode on the first electrode; and
an organic material layer comprising one or more layers provided between the first electrode and the second electrode and comprising the photoactive layer according to claim 1.

9. The organic solar cell of claim 8, wherein the organic material layer further comprises a hole transport layer, a hole injection layer, or a layer which simultaneously transports and injects holes.

10. The organic solar cell of claim 8, wherein the organic material layer further comprises an electron injection layer, an electron transport layer, or a layer which simultaneously injects and transports electrons.

11. The photoactive layer of claim 4, wherein the crystalline polymer material comprises a copolymer comprising a unit of Formula 4:

[Formula 4]

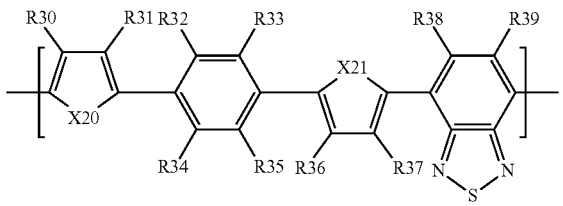

wherein:
X20 and X21 are the same as or different from each other, and are each independently $CR_hR_i$, $NR_h$, O, $SiR_hR_i$, $PR_h$, S, $GeR_hR_i$, Se, or Te; and R30 to R39, $R_h$, and $R_i$ are the same as or different from each other, and are each independently hydrogen, deuterium, a halogen group, a nitrile group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group.

12. The photoactive layer of claim 4, wherein the crystalline polymer material comprises a copolymer comprising a unit of Formula 5:

[Formula 5]

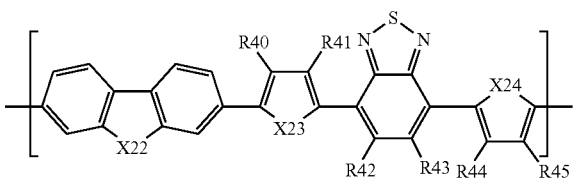

wherein:
X22 to X24 are the same as or different from each other, and are each independently $CR_hR_i$, $NR_h$, O, $SiR_hR_i$, $PR_h$, S, $GeR_hR_i$, Se, or Te; and R40 to R45, $R_h$, and $R_i$ are the same as or different from each other, and are each independently hydrogen, deuterium, a halogen group, a nitrile group, a substituted or unsubstituted alkoxy group, a substituted or unsubstituted alkyl group, a substituted or unsubstituted cycloalkyl group, a substituted or unsubstituted aryl group, or a substituted or unsubstituted heterocyclic group.

13. The photoactive layer of claim 6, wherein the additive is one or more of 1,8-diiodooctane, diphenyl ether, 1-chloronaphthalene, and 1,2-dichlorobenzene.

14. The photoactive layer of claim 1, wherein the volume ratio of the single molecular material to the polymer material is 95:5.

* * * * *

UNITED STATES PATENT AND TRADEMARK OFFICE
CERTIFICATE OF CORRECTION

PATENT NO. : 11,502,255 B2
APPLICATION NO. : 16/488982
DATED : November 15, 2022
INVENTOR(S) : Lim et al.

Page 1 of 1

It is certified that error appears in the above-identified patent and that said Letters Patent is hereby corrected as shown below:

In the Claims

Column 31, Lines 11-30, Claim 1: Please delete Formula 1 and replace with the following:

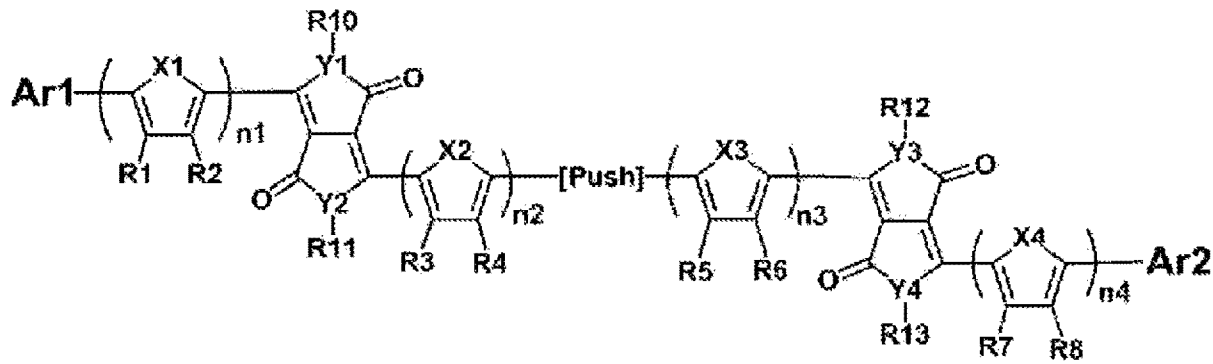

Column 35, Lines 38-47, Claim 11: Please delete Formula 4 and replace with the following:

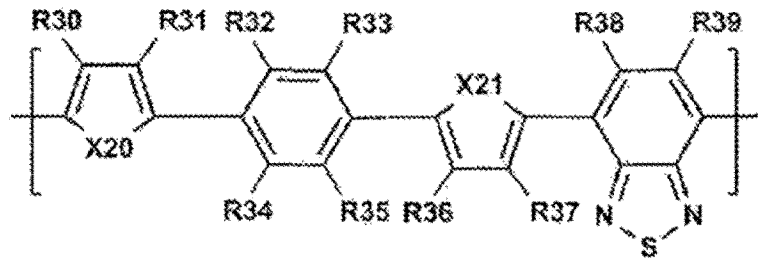

Signed and Sealed this
Fourth Day of April, 2023

Katherine Kelly Vidal
*Director of the United States Patent and Trademark Office*